United States Patent
Park

(10) Patent No.: US 6,987,704 B2
(45) Date of Patent: Jan. 17, 2006

(54) SYNCHRONOUS SEMICONDUCTOR MEMORY DEVICE WITH INPUT-DATA CONTROLLER ADVANTAGEOUS TO LOW POWER AND HIGH FREQUENCY

(75) Inventor: Nak-Kyu Park, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 14 days.

(21) Appl. No.: 10/732,043

(22) Filed: Dec. 10, 2003

(65) Prior Publication Data

US 2004/0240302 A1 Dec. 2, 2004

(30) Foreign Application Priority Data

May 30, 2003 (KR) ...................... 10-2003-0034730

(51) Int. Cl.
*G11C 8/00* (2006.01)
(52) U.S. Cl. ............. 365/233; 365/189.08; 365/230.06
(58) Field of Classification Search ................ 365/233, 365/230.06, 189.08
See application file for complete search history.

(56) References Cited

U.S. PATENT DOCUMENTS 6,754,133 B2 * 6/2004 Morita et al. ............... 365/233

FOREIGN PATENT DOCUMENTS

| KR | 1020000013219 | 3/2000 |
| KR | 1020030008702 | 1/2003 |

* cited by examiner

*Primary Examiner*—Anh Phung
*Assistant Examiner*—Pho M. Luu
(74) *Attorney, Agent, or Firm*—Blakely, Sokoloff, Taylor & Zafman

(57) ABSTRACT

There is provided a synchronous memory device having a simplified data input unit for receiving and transferring data to an internal memory cell block, which is adapted to high frequency and can reduce a power consumption. The synchronous memory device includes: a data alignment unit for aligning in parallel a plurality of data sequentially inputted through one data input pin as many as the number of prefetched data to generate a plurality of aligned data; a global I/O line driving unit for receiving the plurality of aligned data and outputting the even data or the odd data to a memory core area in response to a data input strobe signal; a data input strobe signal generating unit for buffering the clock signal to output the data input strobe signal; and a data input strobe signal control unit for generating a data input strobe control signal used to allow the data input strobe signal generating unit to output the data input strobe signal only at a period when an operation corresponding to the write command is carried out.

14 Claims, 21 Drawing Sheets

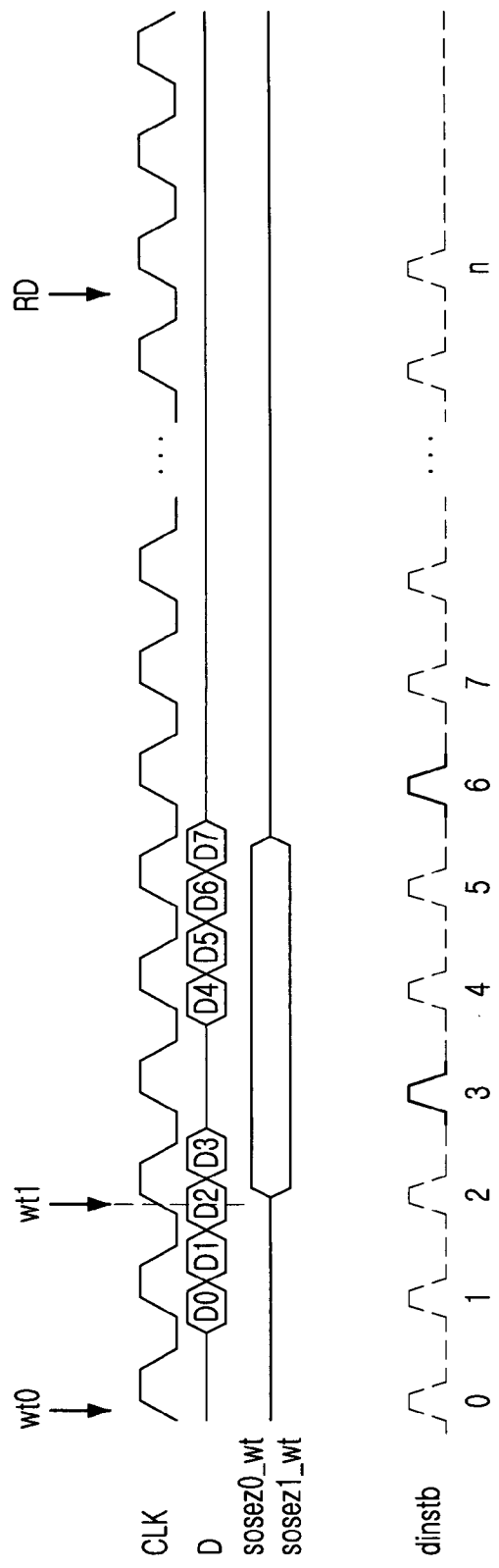

SYNCHRONOUS SEMICONDUCTOR MEMORY DEVICE WITH INPUT-DATA CONTROLLER ADVANTAGEOUS TO LOW POWER AND HIGH FREQUENCY

FIELD OF THE INVENTION

The present invention relates to a semiconductor memory device, and more particularly, to a memory device with an input-data controller, which is advantageous to low power and high-speed operation.

DESCRIPTION OF THE PRIOR ART

With the increase of semiconductor integration, semiconductor memory devices have been steadily improved in order to increase an operating speed. For the purpose of increasing the operating speed, so-called synchronous memory devices have been proposed which are operable in synchronization with clocks provided from an exterior of a memory chip.

An initially proposed memory device is a single data rate (SDR) synchronous memory device which inputs/outputs one data through one data pin at one cycle of clock in synchronization with a rising edge of an external clock.

However, such an SDR synchronous memory device is still insufficient to satisfy a desired speed in a system that requires a high-speed operation. Accordingly, a double data rate (DDR) synchronous memory device is proposed which process two data at one cycle of clock.

The DDR synchronous memory device inputs/outputs successively two data through data I/O pins in synchronization with both rising edges and falling edges of the external clock. Therefore, compared with a conventional SDR synchronous memory device, the DDR synchronous memory device can provide at least two times bandwidths without increasing a frequency of the clock, thereby implementing a high-speed operation as much.

Meanwhile, since the DDR synchronous memory device must input or output two data at one cycle of the clock, it is impossible to employ data access method that has been used to effectively perform the input or output operation in the conventional SDR synchronous memory device.

If a cycle of a clock is about 10 nsec, two data must be processed successively within substantially 6 nsec, which is a time except for rising and falling times (about 0.5×4=2) and other time for specification. However, it is almost hard to perform these processes within the memory device. Accordingly, the memory device inputs/outputs data at rising edges and falling edges of the clock only when inputting/outputting data from/to an exterior of the memory device, and other processes in an inside of the memory device are performed in synchronization with either rising edges or falling edges.

Therefore, a new method for inputting/outputting data is required in order to receive and transfer the data to an internal core area or externally output the data transferred from the core area.

For this purpose, a data input buffer of the DDR synchronous memory device prefetches 2-bit data synchronized with rising edges and falling edges. The prefetched 2-bit data are then synchronized as even data and odd data at rising edges of a main clock and transferred to the internal core area. Meanwhile, in order to implement an accurate timing of data input/output, data strobe signal (DQS) is inputted from a CPU or a memory controller together with the data signal when receiving data.

However, as a speed of a system such as a central processing unit becomes increasingly higher, the memory device needs to be operated much higher. In order to achieve this purpose, there is proposed a 4-bit prefetch data input buffer which prefetches and transfers 4-bit data to an inside of the memory device.

FIG. 1 is a block diagram showing a 4-bit prefetch data input unit of a conventional synchronous memory device.

Referring to FIG. 1, the 4-bit prefetch data input unit of the conventional synchronous memory device includes: a data strobe buffer unit 19 which is enabled in response to an enable signal endinds generated by a write command and outputs rising pulses dsrp4 and falling pulses dsfp4 generated at rising edges and falling edges of the data strobe signal DQS; a data buffer unit 10 for receiving data through a data pin DQ from an outside; a data alignment unit 80 for aligning data which are buffered in the data buffer unit 10 and inputted successively and outputting first to fourth aligned data align_dr0, align_df0, align_dr1 and align_df1; a global I/O line driving unit 20 for receiving the first and fourth aligned data align_dr0, align_df0, align_dr1 and align_df1 and outputting first and second even data gio_ev0 and gio_ev1 or first and second odd data gio_od0 and gio_od1 to a global I/O line in response to even and odd data input strobe signals dinstb_ev0<0:3>, dinstb_ev1<0:3>, dinstb_od0<0:3> and dinstb_od1<0:3>; and a data input strobe signal generating unit 90 for generating the even and odd data input strobe signals dinstb_ev0<0:3>, dinstb_ev1<0:3>, dinstb_od0<0:3> and dinstb od1<0:3>. In FIG. 1, a data input strobe precharge signal dinstb_pcg<0:3> is a control signal for activating the global I/O line driving unit 20.

FIG. 2A is a block diagram of the data alignment unit 80 shown in FIG. 1.

Referring to FIG. 2A, the data alignment unit 80 includes: a first rising latch 11 for latching data outputted from the data buffer unit 10 and outputting a first rising data rising_d0 in response to the rising pulse dsrp4; a second rising latch 12 for latching the first rising data rising_d0 to output the third aligned data align_dr1 in response to the falling pulse dsfp4; a third rising latch 14 for latching the third aligned data align_dr1 to output a second rising data rising_d1 in response to the rising pulse dsrp4; a fourth rising latch 16 for latching the second rising data rising_d1 to output the first aligned data align_dr0 in response to the falling pulse dsfp4; a first falling latch 13 for latching data outputted from the data buffer unit 10 to output the fourth aligned data align_df1 in response to the falling pulse dsfp4; a second falling latch 15 for latching the fourth aligned data align_df1 to output a falling data falling_d1 in response to the rising pulse dsrp4; and a third falling latch 17 for latching the falling data falling_d1 to output the second aligned data align_df0 in response to the falling pulse dsfp4.

FIG. 2B is a block diagram of the global I/O line driving unit 20 shown in FIG. 1.

Referring to FIG. 2B, the global I/O line driving unit 20 includes: a first even data global I/O line driver 20_1a for receiving the first to fourth aligned data align_dr0, align_df0, align_dr1 and align_df1 to output the first even data gio_ev0 in response to the first even and odd data input strobe signals dinstb_ev0<0>, dinstb_ev1<0>, dinstb_od0<0> and dinstb_od1<0>; a first odd data global I/O line driver 20_1b for receiving the first to fourth aligned data align_dr0, align_df0, align_dr1 and align_df1 to output the first odd data gio_od0 in response to the second even and odd data input strobe signals dinstb_ev0<1>, dinstb_ev1<1>, dinstb_od0<1> and dinstb_od1<1>; a second even data global I/O line driver 20_1c for receiving the first to fourth aligned data align_dr0, align_df0, align_dr1 and align_df1 to output the second even data gio_ev1 in response to the third even and odd data input strobe signals dinstb_ev0<2>, dinstb_ev1<2>, dinstb_od0<2> and dinstb_od1<2>; and a second odd data global I/O line driver 20_1d for receiving the first to fourth aligned data align_dr0, align_df0, align_dr1 and align_df1 to output the second odd data gio_od1 in response to the fourth even and odd data input strobe signals dinstb_ev0<3>, dinstb_ev1<3>, dinstb_od0<3> and dinstb_od1<3>.

Meanwhile, a typical memory device includes a plurality of input pins and receives a plurality of data in parallel at the same time. For this purpose, the memory device includes a plurality of data buffer units and data alignment units, which buffer and align data inputted through a plurality of data input pins.

FIG. 3 is a block diagram showing a plurality of global I/O line driving units for receiving and buffering data inputted through a plurality of data input pins to output even data and odd data in a memory device.

Referring to FIG. 3, the memory device includes: a first global I/O line driving unit 20_1 for receiving first to fourth aligned data align_dr0<0>, align_df0<0>, align_dr1<0> and align_df1<0>, which are inputted through a first data input pin DQ0, buffered by a first data buffer unit 70_1 and aligned by a first data alignment unit 30_1, and outputting first and second even data gio_ev0<0> and gio_ev1<0> or first and second odd data gio_od0<0> and gio_od1<0> in response to even and odd data input strobe signals dinstb_ev0<0:3>, dinstb_ev1<0:3>, dinstb_od0<0:3> and dinstb_od1<0:3>; a second global I/O line driving unit 20_2 for receiving first to fourth aligned data align_dr0<1>, align_df0<1>, align_dr1<1> and align_df1<1>, which are inputted through a second data input pin DQ1, buffered by a second data buffer unit 70_2 and aligned by a second data alignment unit 30_2, and outputting first and second even data gio_ev0<1> and gio_ev1<1> or first and second odd data gio_od0<1> and gio_od1<1> in response to the even and odd data input strobe signals dinstb_ev0<0:3>, dinstb_ev1<0:3>, dinstb_od0<0:3> and dinstb_od1<0:3>; and an n-th global I/O line driving unit 20_n for receiving first to fourth aligned data align_dr0<n>, align_df0<n>, align_dr1<n> and align_df1<n>, which are inputted through an n-th data input pin DQn, buffered by an n-th data buffer unit 70_n and aligned by an n-th data alignment unit 30_n, and outputting first and second even data gio_ev0<n> and gio_ev1<n> or first and second odd data gio_od0<n> and gio_od1<n> in response to the even and odd data input strobe signals dinstb_ev0<0:3>, dinstb_ev1<0:3>, dinstb_od0<0:3> and dinstb_od1<0:3>.

Here, the data alignment units 70_1 to 70_n are a block that includes the rising latches and the falling latches shown in FIG. 2A and aligns the data, which are inputted successively through the respective data buffer units, into the four aligned data align_dr0, align_df0, align_dr1 and align_df1.

FIG. 4 is a block diagram of the data input strobe signal generating unit 90 shown in FIG. 1.

Referring to FIG. 4, the data input strobe signal generating unit 90 includes: a clock pulse signal generator 60 for receiving a clock signal CLK to generate a clock pulse signal dinclkp; a write address decoder 50 for decoding first and second address signals sosez0_wt and sosez1_wt, which are lower bit (address 0 and address 1) signals of addresses inputted corresponding to a write command for a data write operation, and outputting first to fourth data input strobe select signals sosez01wt<0> to sosez01wt<3>; a first even data input strobe signal generator 41 for outputting first even and odd data input strobe signals dinstb_ev0<0>, dinstb_ev1<0>, dinstb_od0<0> and dinstb_od1<0> in response to the data select signals sosez01wt<0> to sosez01wt<3>, which are outputted from the write address decoder 50, in synchronization with the clock pulse signal dinclkp; a first odd data input strobe signal generator 42 for outputting second even and odd data input strobe signals dinstb_ev0<1>, dinstb_ev1<1>, dinstb_od0<1> and dinstb_od1<1> in response to the data select signals sosez01wt<0> to sosez01wt<3>, which are outputted from the write address decoder 50, in synchronization with the clock pulse signal dinclkp; a second even data input strobe signal generator 43 for outputting third even and odd data input strobe signals dinstb_ev0<2>, dinstb_ev1<2>, dinstb_od0<2> and dinstb_od1<2> in response to the data select signals sosez01wt<0> to sosez01wt<3>, which are outputted from the write address decoder 50, in synchronization with the clock pulse signal dinclkp; and a second odd data input strobe signal generator 44 for outputting fourth even and odd data input strobe signals dinstb_ev0<3>, dinstb_ev1<3>, dinstb_od0<3> and dinstb_od1<3> in response to the data select signals sosez01wt<0> to sosez01wt<3>, which are outputted from the write address decoder 50, in synchronization with the clock pulse signal dinclkp.

Here, a control signal seq_intz shown in FIG. 4 is a signal determined by a set information of a mode register set at an initialization period of the memory device. In case of a sequential mode, the control signal seq_intz maintains a high level, and in case of an interleave mode, the control signal seq_intz maintains a low level. The "sequential" or "interleave" type represents a data input pattern. For example, if data is inputted in order of D0, D1, D2 and D3 in the sequential mode, data is inputted in order of D0, D3, D2 and D1 in the interleave mode.

FIG. 5 is a circuit diagram of the clock pulse signal generator shown in FIG. 4.

Referring to FIG. 5, the clock pulse signal generator 60 includes: an inverter I1 for inverting the clock signal clk; a delay unit 61 for delaying an output of the inverter I1 for a predetermined time; a NOR gate NOR1 receiving the output of the inverter I1 and an output of the delay unit 61; an inverter I2 for inverting an output of the NOR gate NOR1; and an inverter I3 for inverting an output of the inverter I2 to output the clock pulse signal dinclkp.

FIG. 6 is a circuit diagram of the write address decoder shown in FIG. 4.

Referring to FIG. 6, the write address decoder 50 includes: an inverter I4 for inverting the first address signal sosez0_wt to output a first decoding signal sesoz0_wt; an inverter I5 for inverting the second address signal sosez1_wt to output a second decoding signal sesoz1_wt; a NAND gate ND1 receiving the first and second decoding signals sesoz0_wt and sesoz1_wt; an inverter I6 for inverting an output of the NAND gate ND1 to output the first data input strobe select signal sosez01wt<0>; a NAND gate ND2 receiving the first address signal sosez0_wt and the second decoding signal sesoz1_wt; an inverter I7 for inverting an output of the NAND gate ND2 to output the second data input strobe select signal sosez01wt<1>; a NAND gate ND3 receiving the first decoding signal sesoz0_wt and the second address signal sosez1_wt; an inverter I8 for inverting an output of the NAND gate ND3 to output the third data input strobe select signal sosez01wt<2>; a NAND gate ND4 receiving the first and second address signal sosez0_wt and sesoz1_wt; and an inverter I9 for inverting an output of the NAND gate ND4 to output the fourth data input strobe select signal sosez01wt<3>.

FIG. 7 is a circuit diagram of the first even data input strobe signal generator 41 shown in FIG. 4.

Referring to FIG. 7, the first even data input strobe signal generator 41 includes: a NAND gate ND5 receiving the first data input strobe select signal sosez01wt<0> and the clock pulse signal dinclkp; a NAND gate ND6 receiving the fourth data input strobe select signal sosez01wt<3> and the clock pulse signal dinclkp; a NAND gate ND9 receiving outputs of the NAND gates ND5 and ND6 to output a first precharge signal eo0; an inverter I10 for inverting an output of the NAND gate ND5 to output the first even data input strobe signal dinstb_ev0<0>; an inverter I11 for inverting the output of the NAND gate ND6 to output the first odd data input strobe signal dinstb_odd0<0>; a NAND gate ND7 receiving the third data input strobe select signal sosez01wt<2> and the clock pulse signal dinclkp; a NAND gate ND8 receiving the second data input strobe select signal sosez01wt<1> and the clock pulse signal dinclkp; a NAND gate ND10 receiving outputs of the NAND gates ND7 and ND8 to output a second precharge signal eo1; an inverter I12 for inverting the output of the NAND gate ND7 to output the second even data input strobe signal dinstb_ev1<0>; an inverter I13 for inverting the output of the NAND gate ND8 to output the second odd data input strobe signal dinstb_od1<0>; a NOR gate NOR2 receiving the first and second precharge signals eo0 and eo1; and an inverter I14 for inverting an output of the NOR gate NOR2 to output the first data input strobe precharge signal dinstb_pcg<0>.

Meanwhile, as shown in FIG. 4, the second even data input strobe signal generator 43 is configured with the same structure as the first even data input strobe signal generator 41 except for the even and odd data input strobe signals dinstb_ev0<2>, dinstb_od0<2>, dinstb_ev1<2> and dinstb_od1<2> that are outputted in a sequence of the first to fourth data input strobe select signals sosez01wt<0> to sosez01wt<3>. Therefore, a description and a drawing of the second even data input strobe signal generator 43 will be omitted.

FIG. 8 is a circuit diagram of the first odd data input strobe signal generator 42 shown in FIG. 4.

Referring to FIG. 8, the first odd data input strobe signal generator 42 includes: transmission gates T1 and T2 that are selectively turned on in response to the control signal seq_intz, which maintains a low level in the interleave mode and a high level in the sequential mode, to transmit the first data input strobe select signal sosez01wt<0> or the third data input strobe select signal sosez01wt<2>; transmission gates T3 and T4 that are selectively turned on in response to the control signal seq_intz to transmit the first data input strobe select signal sosez01wt<0> or the third data input strobe select signal sosez01wt<2>; a NAND gate ND9 receiving the second data input strobe select signal sosez01wt<1> and the clock pulse signal dinclkp; a NAND gate ND10 receiving the clock pulse signal dinclkp and the data input strobe select signal sosez01wt<0> or sosez01wt<2> transmitted from the transmission gate T1 or T2; a NAND gate ND13 for receiving outputs of the NAND gates ND10 and ND9 to output a first precharge signal eo2; an inverter I15 for inverting the output of the NAND gate ND9 to output the first even data input strobe signal dinstb_ev0<1>; an inverter I16 for inverting the output of the NAND gate ND10 to output the first odd data input strobe signal dinstb_od0<1>; a NAND gate ND11 receiving the fourth data input strobe select signal sosez01wt<3> and the clock pulse signal dinclkp; a NAND gate ND12 receiving the clock pulse signal dinclkp and the data input strobe select signal sosez01wt<0> or sosez01wt<2> transmitted from the transmission gate T3 or T4; a NAND gate ND14 receiving outputs of the NAND gates ND12 and ND11 to output a second precharge signal eo3; an inverter I17 for inverting the output of the NAND gate ND11 to output the second even data input strobe signal dinstb_ev1<1>; an inverter I18 for inverting the output of the NAND gate ND12 to output the second odd data input strobe signal dinstb_od1<1>; a NOR gate NOR3 receiving the first and second precharge signals eo2 and eo3; and an inverter I19 for inverting an output of the NOR gate NOR3 to output the second data input strobe precharge signal dinstb_pcg<1>.

Meanwhile, as shown in FIG. 4, the second odd data input strobe signal generator 44 is configured with the same structure as the first odd data input strobe signal generator 42 except for the even and odd data input strobe signals dinstb_ev0<3>, dinstb_od0<3>, dinstb_ev1<3> and dinstb_od1<3> that are outputted in a sequence of the first to fourth data input strobe select signals sosez01wt<0> to sosez01wt<3>. Therefore, a description and a drawing of the second odd data input strobe signal generator 43 will be omitted.

FIG. 9 is a waveform showing an alignment of four data in the memory device of FIG. 1. Hereinafter, an operation of aligning four data inputted through one data input pin DQ will be described with reference to FIGS. 1 to 9.

First, data D0 to D7 are inputted in synchronization with the rising and falling edges of the clock signal CLK, and clocking data strobe signal DQS are then inputted at a timing at which the data are inputted.

The data strobe buffer unit 190 is enabled in response to the enable signal endinds generated by the write command and generates the rising pulse dsrp4 and the falling pulse dsfp4, which are respectively outputted in pulse forms at the rising edges and the falling edges of the data strobe signal DQS.

Then, the first rising latch 11 latches the first, third, fifth and seventh data D0, D2, D4 and D6 and outputs the first rising data rising_d0 in synchronization with the rising pulse dsrp4.

The second rising latch 12 latches the first rising data rising_d0 and outputs the third aligned data align_dr1 in synchronization with the falling pulse dsfp4, and the first falling latch 13 latches the second, fourth, sixth and eighth data D1, D3, D5 and D7 and outputs the fourth aligned data align_df1 in synchronization with the falling pulse dsfp4.

Then, the third rising latch 14 latches the third aligned data align_dr1 and outputs the second rising data rising_d1 in synchronization with the rising pulse dsrp4, and the second falling latch 15 latches the fourth aligned data align_df1 and outputs the falling data falling_d1 in synchronization with the rising pulse dsrp4.

The fourth rising latch 16 latches the second rising data rising_d1 and outputs the first aligned data align_dr0 in synchronization with the falling pulse dsfp4, and the third falling latch 17 latches the falling data falling_d1 and outputs the second aligned data align_df0.

Then, the global I/O line driving unit 20 receives the four aligned data align_dr0, align_df0, align_dr1 and align_df1 and outputs the first and second even data gio_ev0 and gio_ev1 or the first and second odd data gio_od1 and gio_od1 in response to the first and second even data strobe signals dinstb_ev0<0:3> and dinstb_ev1<0:3> and the first and second odd data strobe signals dinstb_od0<0:3> and dinstb_od1<0:3>.

FIG. 10 is a waveform showing an operation of generating the data input strobe signals and an operation of inputting the four aligned data through the global I/O line driving unit in response to the data input strobe signals in the conventional memory device.

Hereinafter, the operation of generating the data input strobe signals and the operation of inputting the four aligned data through the global I/O line driving unit in response to the data input strobe signals will be described with reference to FIGS. 1 to 10.

First, the write commands wt0 and wt1 are inputted, and the data D0 to D7 synchronized with the addresses and the clock signal CLK are then inputted in response to the write commands wt0 and wt1. Here, the data D0 to D3 are inputted in response to the write command wt0 and the data D4 to D7 are inputted in response to the write command wt1. Meanwhile, the control signal wtrzt is a signal that maintains a high level during the write operation.

Then, the clock pulse signal generator 60 shown in FIG. 4 receives the clock signal CLK to generate the clock pulse signal dinclkp in a pulse form. The write address decoder 50 decodes the first and second address signals sosez0_wt and sosez1_wt to output the first to fourth data input strobe select signals sosez01wt<0> to sosez01wt<3>. Here, the first and second address signals sosez0_wt and sosez1_wt are signals generated by buffering last 2-bit address signals address0 and address1 among the addresses inputted in response to the write commands.

As shown, in case the first and second address signals sosez0_wt and sosez1_wt are the low level at a period "A", the first data input strobe select signal sosez01wt<0> among the data input strobe select signals sosez01wt<0> to sosez01wt<3> maintains a high level and the remaining data input strobe select signals sosez01wt<1> to sosez01wt<3> maintain the low level.

Here, the period "A" is a period at which the address signal inputted in response to the write command wt0 is decoded to output the first to fourth data input strobe select signals sosez01wt<0> to sosez01wt<3>, and the period "B" is a period at which the address signal inputted in response to the write command wt1 is decoded to output the first to fourth data input strobe select signals sosez01wt<0> to sosez01wt<3>.

Then, the first even data input strobe signal generator 41 receives the first to fourth data input strobe select signals sosez01wt<0> to sosez01wt<3> from the write address decoder 50 and outputs the first and second even data input strobe signals dinstb_ev0<0> and dinstb_ev1<0> and the first and second odd data input strobe signals dinstb_od0<0> and dinstb_od1<0> in response to the clock pulse signal dinclkp.

Specifically, in the first even data input strobe signal generator 41, the four NAND gates ND5 to ND8 are selected in response to the first to fourth data input strobe select signals sosez01wt<0> to sosez01wt<3>, and the clock pulse signal dinclkp is outputted as the selected input strobe signal (e.g., the first even data input strobe signal dinstb_ev0<0>) through the selected NAND gate (e.g., ND5).

Additionally, the remaining data input strobe signals dinstb_ev1<0>, dinstb_od0<0> and dinstb_od1<0> are maintained at the low level.

Here, the first data input strobe precharge signal dinstb_pcg<0> is a signal for enabling the first even data global I/O line driver 20_1a and generated by the control signals eo0 and eo1. At least one of the control signals eo0 and eo1 maintains the high level if any one of the first to fourth data input strobe select signals sosez01wt<0> to sosez01wt<3> maintains the high level.

Meanwhile, the first odd data input strobe signal generator 42 operates in the same manner as the first even data input strobe signal generator 41. The first odd data input strobe signal generator 42 receives the first to fourth data input strobe select signals sosez01wt<0> to sosez01wt<3> and outputs the first and second even data input strobe signals dinstb_ev0<1> and dinstb_ev1<1> and the first and second odd data input strobe signals dinstb_od0<1> and dinstb_od1<1> in response to the clock pulse signal dinclkp.

At this time, the first data input strobe select signal sosez01wt<0> of a high level is inputted and the NAND gate ND10 is selected. Then, the clock pulse signal dinclkp is outputted as the first odd data input strobe signal dinstb_od0<1>. As described above, the control signal seq_intz is a signal determined by the data type. In other words, in case of the sequential mode, the control signal seq_intz maintains the high level, and in case of the interleave mode, the control signal seq_intz maintains the low level. The second data input strobe precharge signal dinstb_pcg<1> for enabling the first odd data global I/O line driver 20_1b is outputted. The second data input strobe precharge signal dinstb_pcg<1> is generated by the control signals eo2 and eo3.

Additionally, the second even data input strobe signal generator 43 and the second odd data input strobe signal generator 44 operate in the same manner as the first even data strobe signal generator 41 and the first odd data input strobe signal generator 42 except for a sequence of the first to fourth data input strobe select signals sosez01wt<0> to sosez01wt<3>.

As shown in FIG. 10, the second even data input strobe signal generator 43 clocks the second even data input strobe signal dinstb_ev1<2>, and the second odd data input strobe signal generator 44 clocks the second odd data input strobe signal dinstb_od1<3>. Meanwhile, the first to fourth data input strobe precharge signals dinstb_pcg<0> to dinstb_pcg<3> are used as the enable signals of the global I/O line drivers 20_1a to 20_1d shown in FIG. 2B.

The first even data global I/O line driver 20_1a shown in FIG. 2B receives the four aligned data align_dr0, align_df0, align_dr1 and align_df1 inputted from the first data alignment unit 30_1 and outputs the data D0 as the first even data gio_ev0, in which the data D0 is selected by the first even data input strobe signal dinstb_ev0<0>.

The second even data global I/O line driver 20_1c receives the four aligned data align_dr0, align_df0, align_dr1 and align_df1 inputted from the first data alignment unit 30_1 and outputs the data D2 as the second even data gio_ev1, in which the data D2 is selected by the second even data input strobe signal dinstb_ev1<2>.

In the first and second odd data global I/O line drivers 20_1b and 20_1d, the data D1 and D3 selected by the first and second odd data input strobe signals dinstb_od0<1> and dinstb_od0<3> are outputted as the first and second odd data gio_od0 and gio_od1. The first and second even data gio_ev0 and gio_ev1 and the first and second odd data gio_od0 and gio_od1 are transferred to a cell block of the memory and stored into the corresponding unit cells.

Additionally, the period "B" is a period at which the first and second address signals sosez0_wt and sosez1_wt corresponding to the write command wt1 are inputted and decoded. Since the operation at the period "B" is performed in the same manner as the operation at the period "A", a detailed description of the operation at the period "B" will be omitted.

FIGS. 11A and 11B are waveforms showing a problem of the conventional memory device. Here, FIG. 11a is a waveform showing a data write operation when a write command is inputted successively, and FIG. 11B is a waveform showing a data write operation when a write command is inputted at an interval of one clock.

As described above, according to the conventional memory device, the data D0 to D7 inputted in synchronization with the clock signal CLK during a write operation are aligned and selected as the even data gio_ev0 and gio_ev1 or the odd data gio_od0 and gio_od1 in response to the data input strobe signal dinstb_?, and then transferred to the internal cell block. Here, the data input strobe signal dinstb_? is one of the first and second even data input strobe signals dinstb_ev0<0:3> and dinstb_ev1<0:3> and the first and second odd data input strobe signals dinstb_od0<0:3> and dinstb_od1<0:3>.

Here, in FIG. 11A, only the third and fifth data input strobe signals dinstb_? are actually used during the data write operation, and in FIG. 11B, only the third and sixth data input strobe signals dinstb_? are actually used during the data write operation.

However, even when the data input strobe signal dinstb_? is not required, the clocking is performed continuously, thereby causing an unnecessary power consumption.

Meanwhile, the data input strobe signal dinstb_? must maintain a predetermined timing T1 with respect to a period at which the first and second address signals sosez0_wt and sosez1_wt are inputted. However, it is very difficult to maintain the timing T1 in the structure in which the data input strobe signal dinstb_? is continuously clocked regularly.

Accordingly, in order to solve the problem, the first and second address signals sosez0_wt and sosez1_wt are delayed for a predetermined time to match them with the timing of the data input strobe signal dinstb_?. However, as the operating frequency of the memory device becomes higher, it is more difficult to match the first and second address signals sosez0_wt and sosez1_wt with the timing of the data input strobe signal dinstb_?. Therefore, the possibility of malfunctions increases much more.

Additionally, as shown in FIG. 4, the first and second even and odd data input strobe signals dinstb_ev0<0:3>, dinstb_ev1<0:3>, dinstb_od0<0:3> and dinstb_01<0:3> are divided and outputted to the global I/O line drivers 20_1 to 20_n, so that the data input circuit for receiving the data becomes complicated. Particularly, there occurs a problem that the circuit occupies a large area in view of a layout.

SUMMARY OF THE INVENTION

It is, therefore, a primary object of the present invention to provide a synchronous memory device having a simplified data input unit for receiving and transferring data to an internal memory cell block compared with the related art, which is adapted to high frequency and can reduce a power consumption.

In accordance with a preferred embodiment of the present invention, there is provided a synchronous memory device which comprises: a data alignment means for aligning in parallel a plurality of data sequentially inputted through one data input pin as many as the number of prefetched data to generate a plurality of aligned data; a global I/O line driving means for receiving the plurality of aligned data and outputting the even data or the odd data to a memory core area in response to a data input strobe signal; a data input strobe signal generating means for buffering the clock signal to output the data input strobe signal; and a data input strobe signal control means for generating a data input strobe control signal used to allow the data input strobe signal generating means to output the data input strobe signal only at a period when an operation corresponding to the write command is carried out.

BRIEF DESCRIPTION OF THE DRAWINGS

The above and other objects and features of the present invention will become apparent from the following description of the preferred embodiments given in conjunction with the accompanying drawings, in which:

FIGS. 11A and 11B are waveforms showing a problem of a conventional memory device;

DETAILED DESCRIPTION OF THE PREFERRED EMBODIMENTS

The preferred embodiments will be described below in detail with reference to accompanying drawings.

Figure 1:
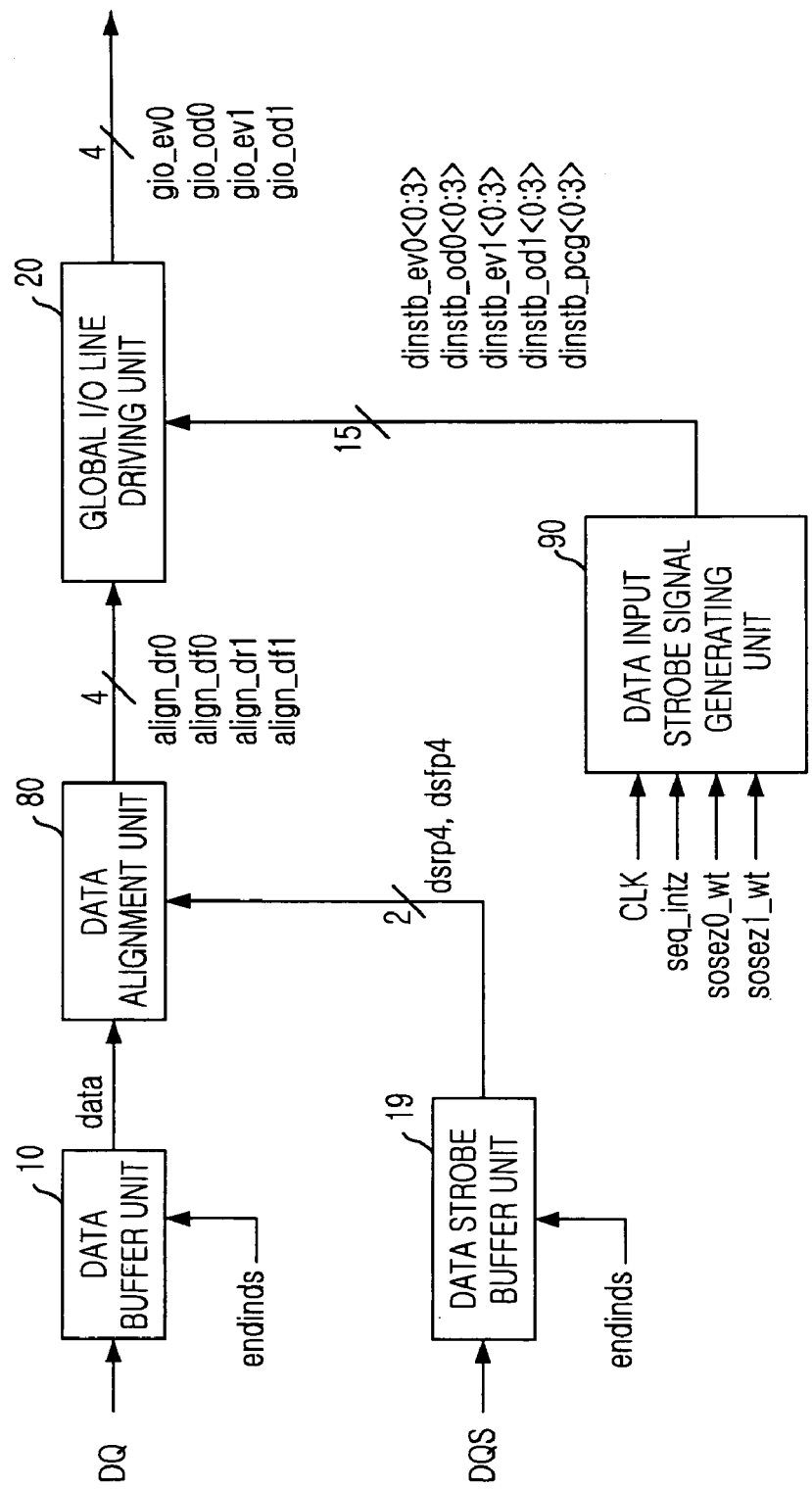
FIG. 1 is a block diagram of a conventional semiconductor memory device.
Figure 2A:
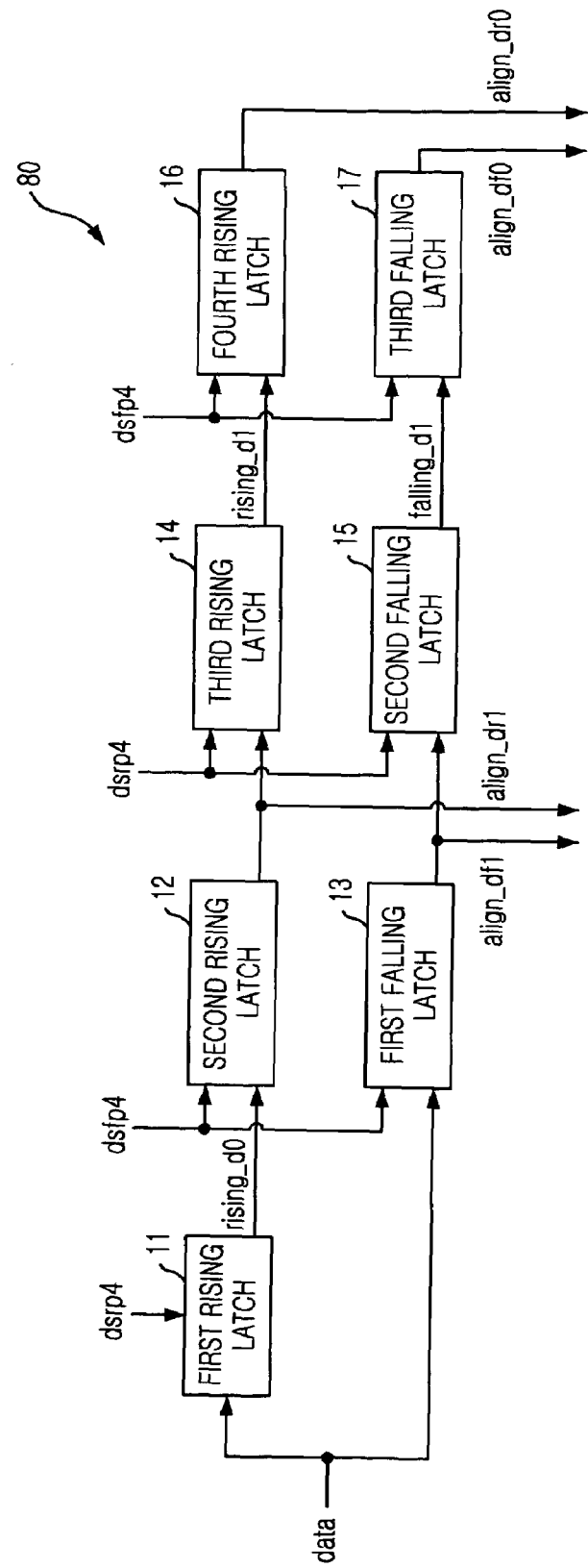
FIG. 2A is a block diagram of a data alignment unit shown in FIG. 1.
Figure 2B:
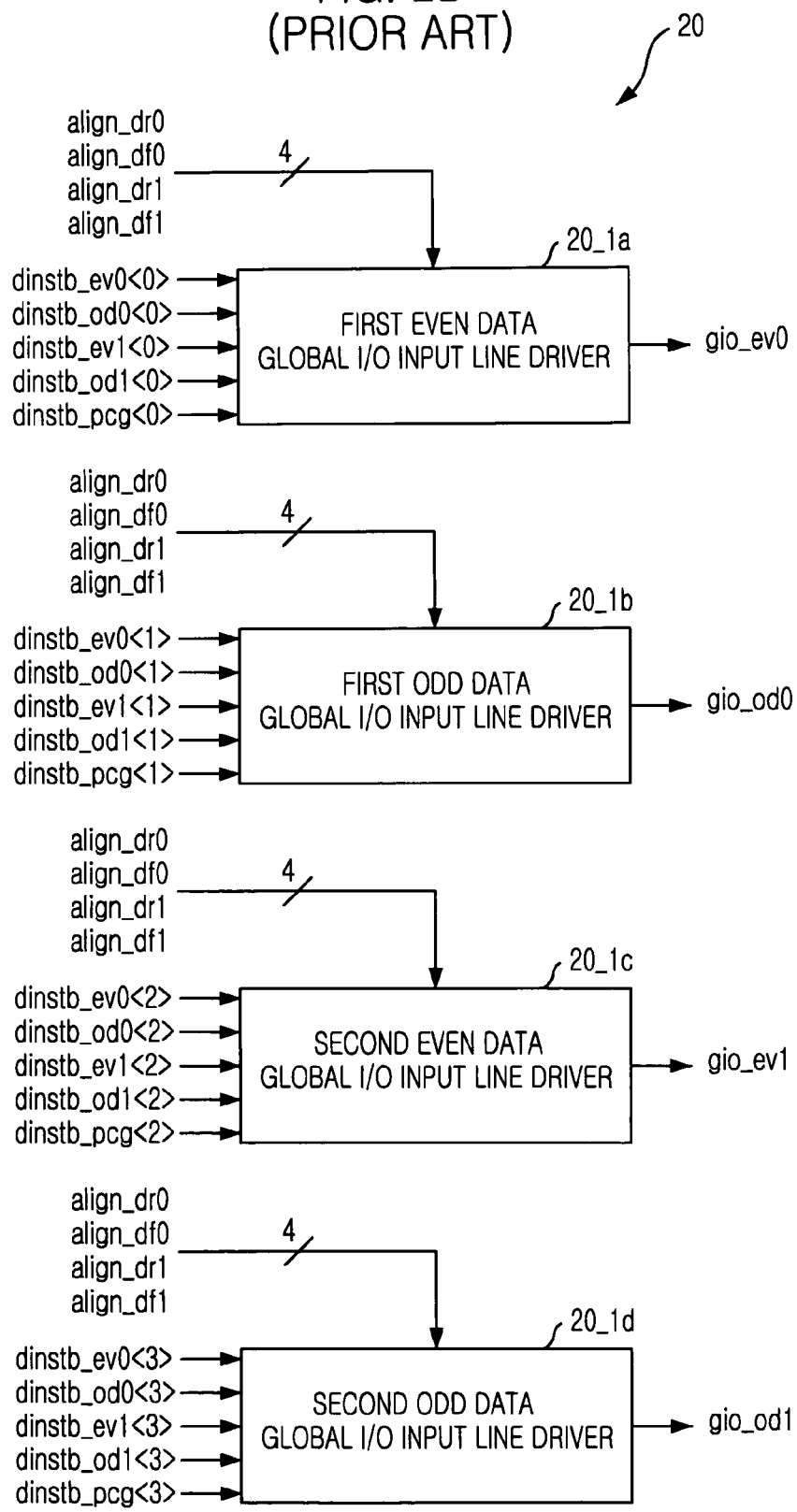
FIG. 2B is a block diagram of a global I/O line driving unit shown in FIG. 1.
Figure 3:
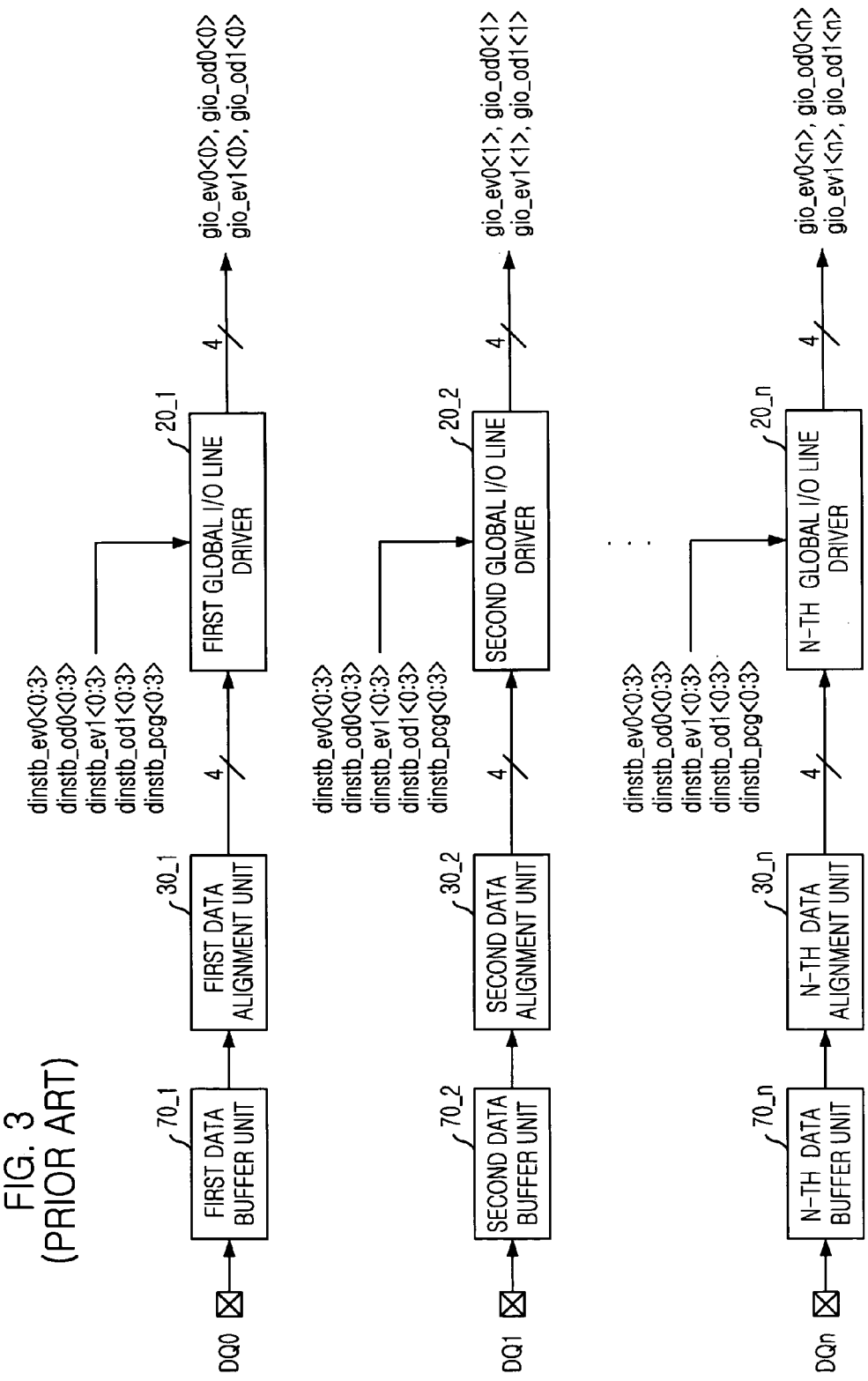
FIG. 3 is a block diagram of a plurality of global I/O line driving units, in which data inputted through a plurality of data pins are aligned and outputted as even data and odd data.
Figure 4:
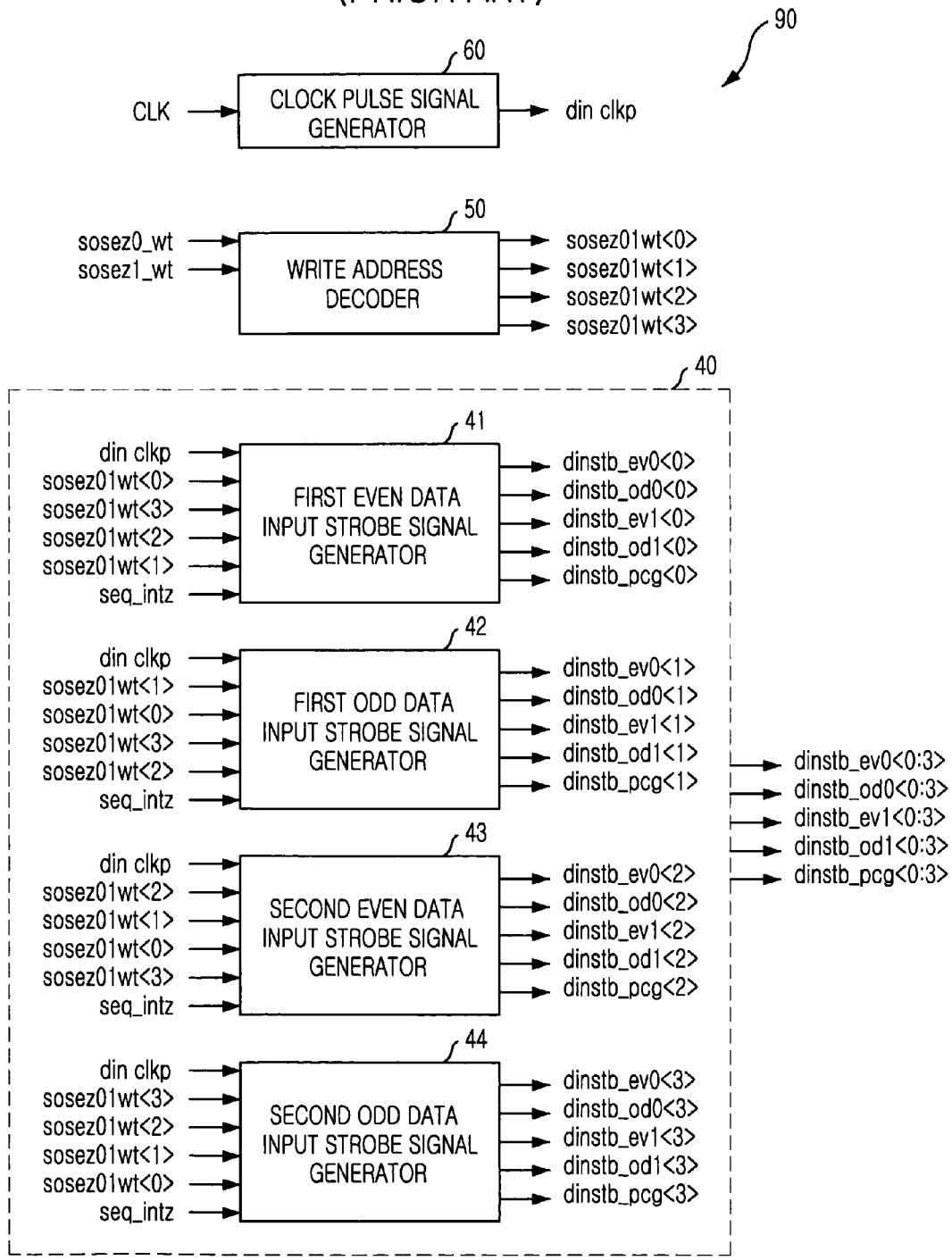
FIG. 4 is a block diagram of a data input strobe signal generating unit shown in FIG. 1.
Figure 5:
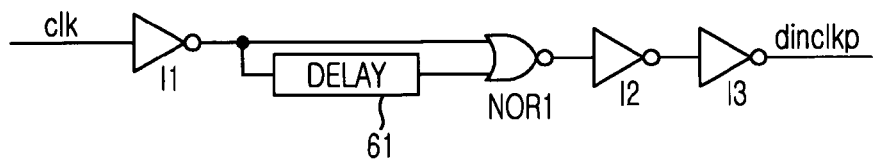
FIG. 5 is a circuit diagram of a clock pulse signal generating unit shown in FIG. 4.
Figure 6:
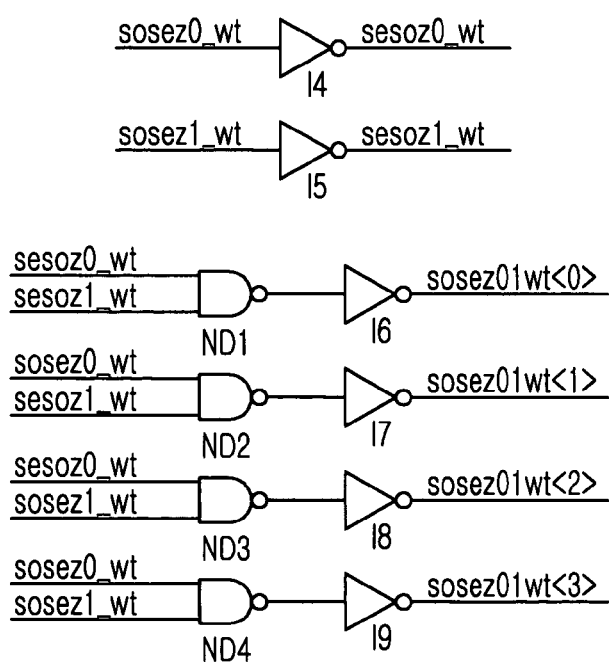
FIG. 6 is a circuit diagram of a write address detecting unit shown in FIG. 4.
Figure 7:
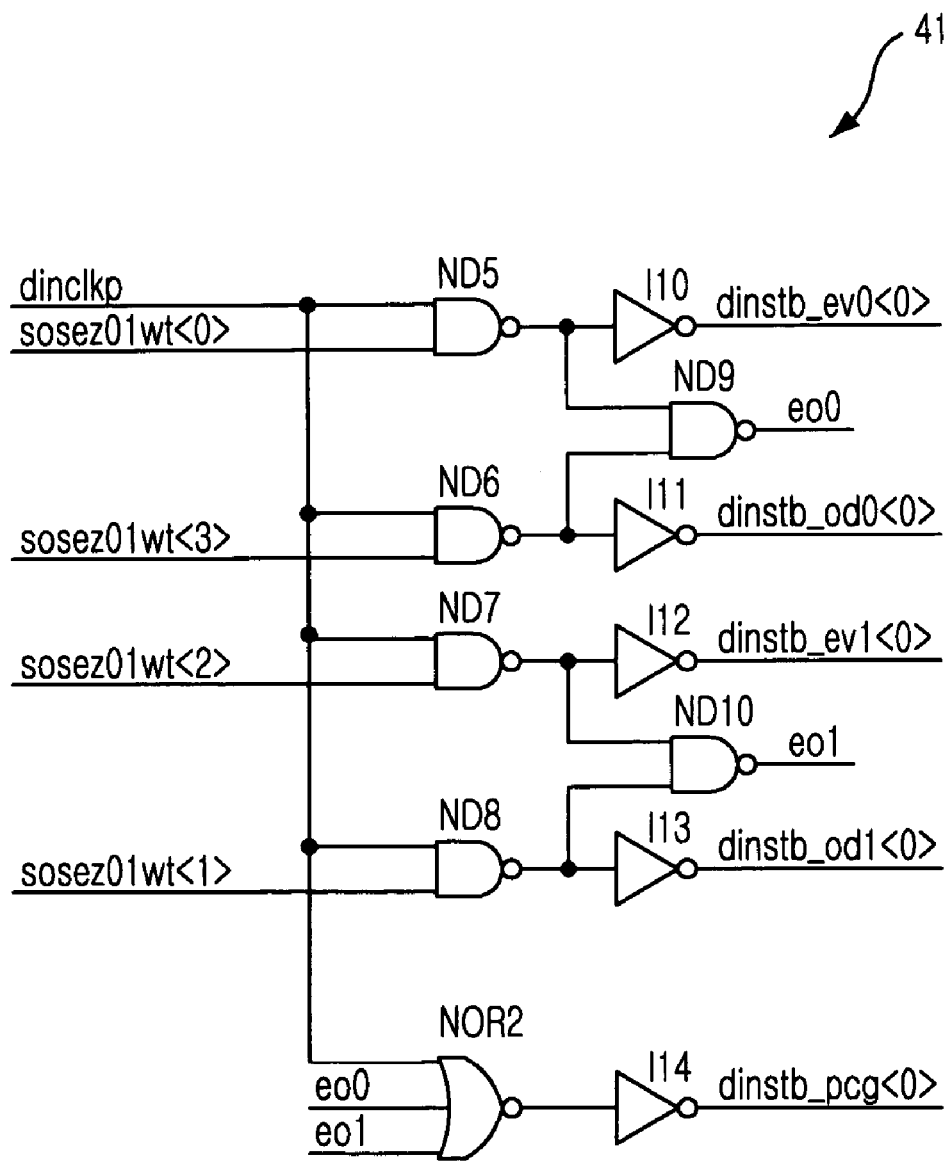
FIG. 7 is a circuit diagram of a first even data input strobe signal generating unit shown in FIG. 4.
Figure 8:
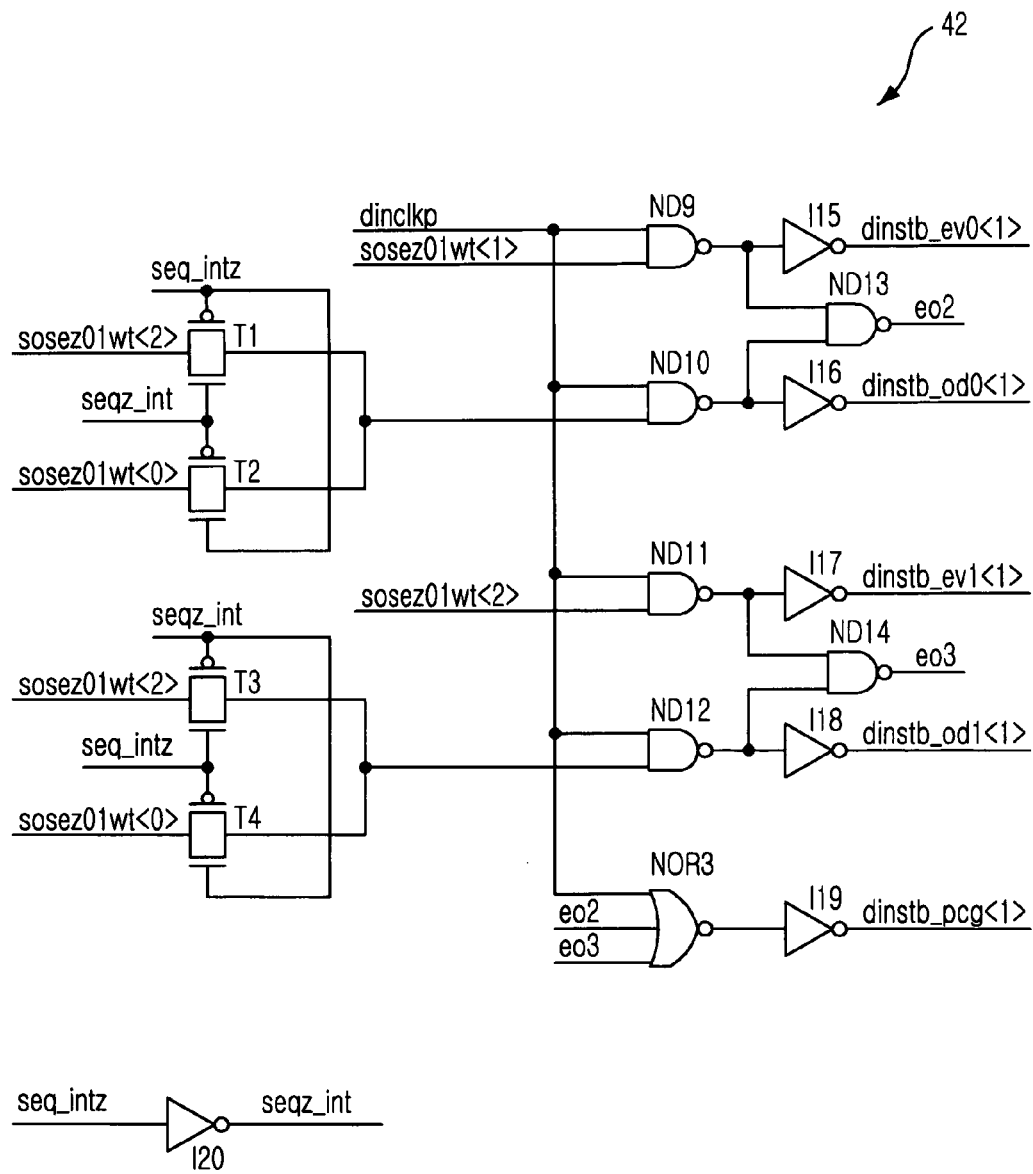
FIG. 8 is a circuit diagram of a first odd data input strobe signal generating unit shown in FIG. 4.
Figure 9:
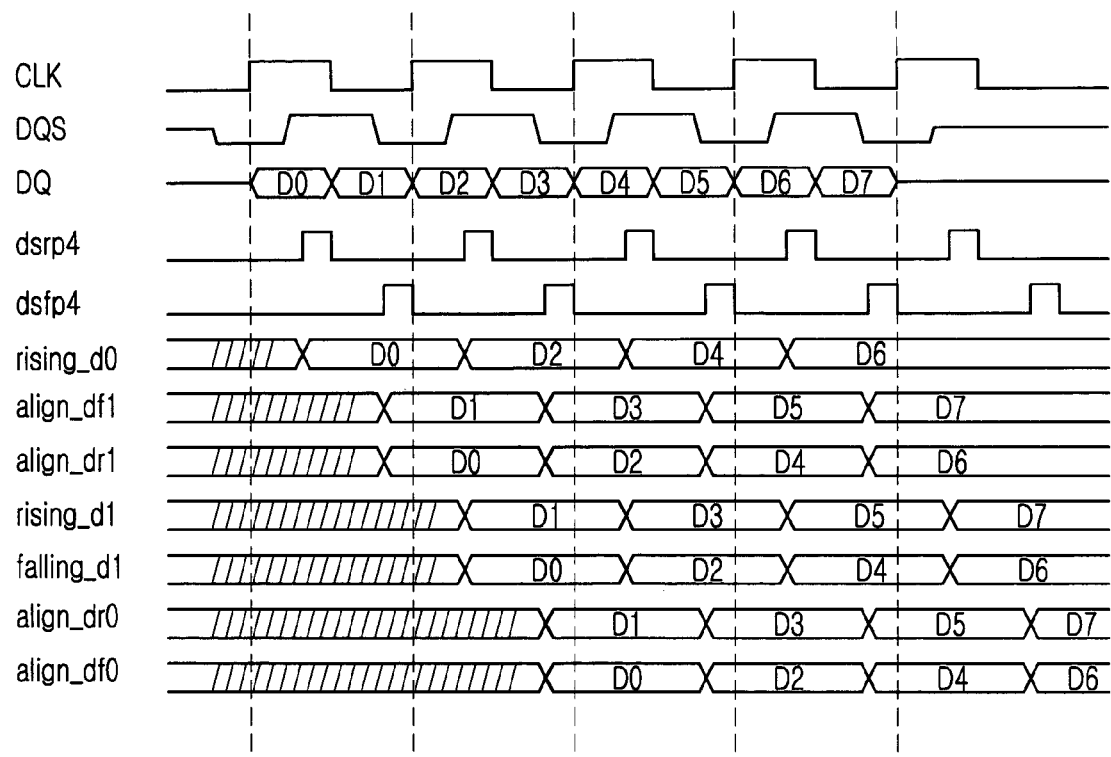
FIG. 9 is a waveform showing an alignment of four data in a semiconductor memory device of FIG. 1.
Figure 10:
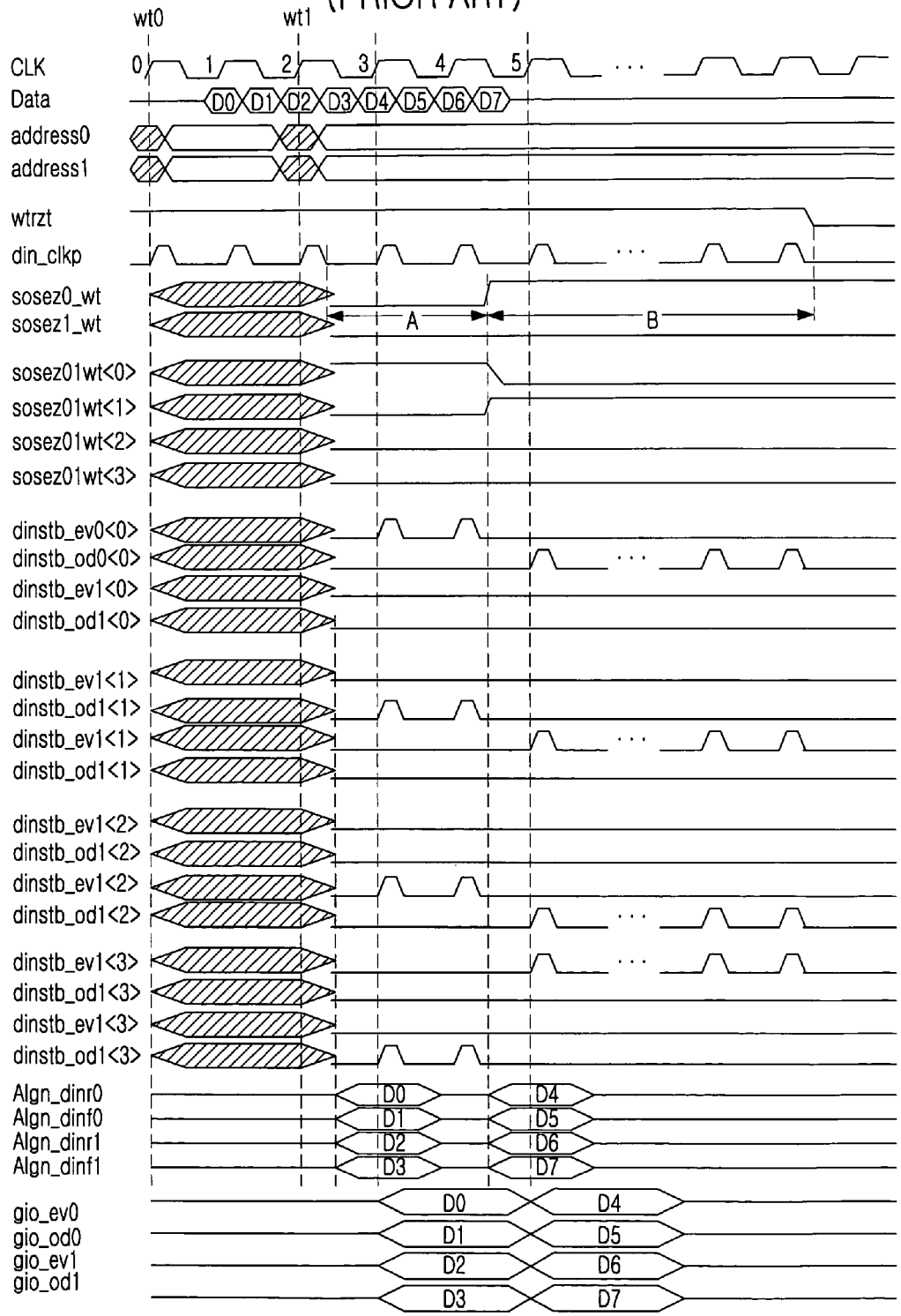
FIG. 10 is a waveform showing an operation of generating a data input strobe signal and an operation of receiving four aligned data in response of the data input strobe signal in a conventional memory device.
Figure 11A:
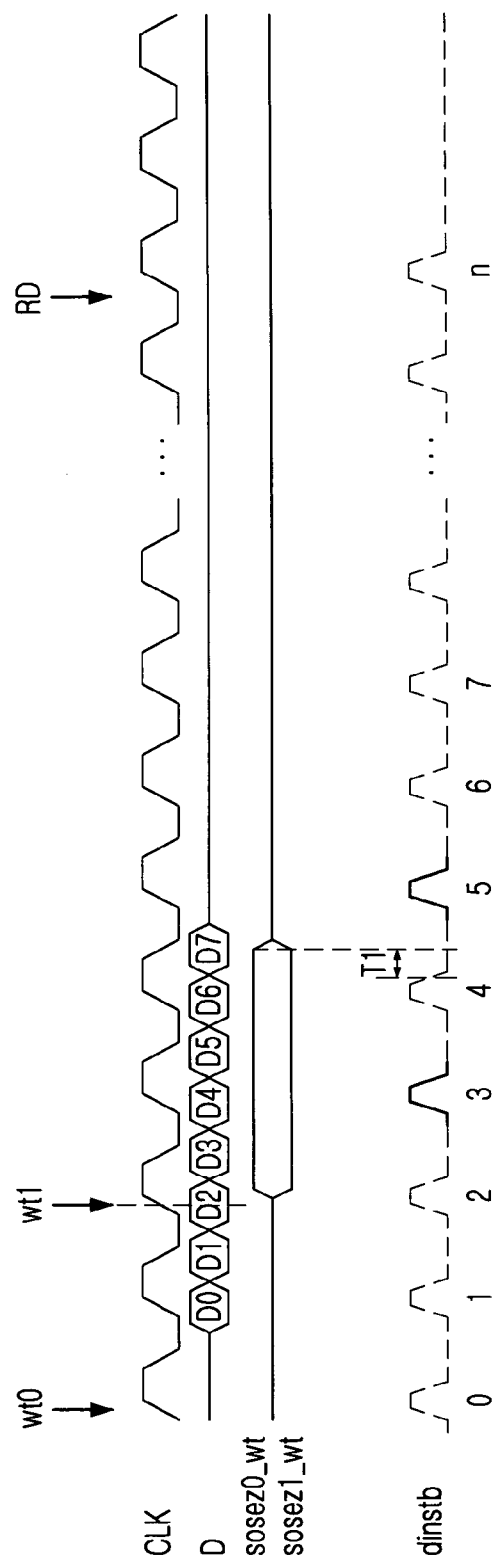
Figure 12:
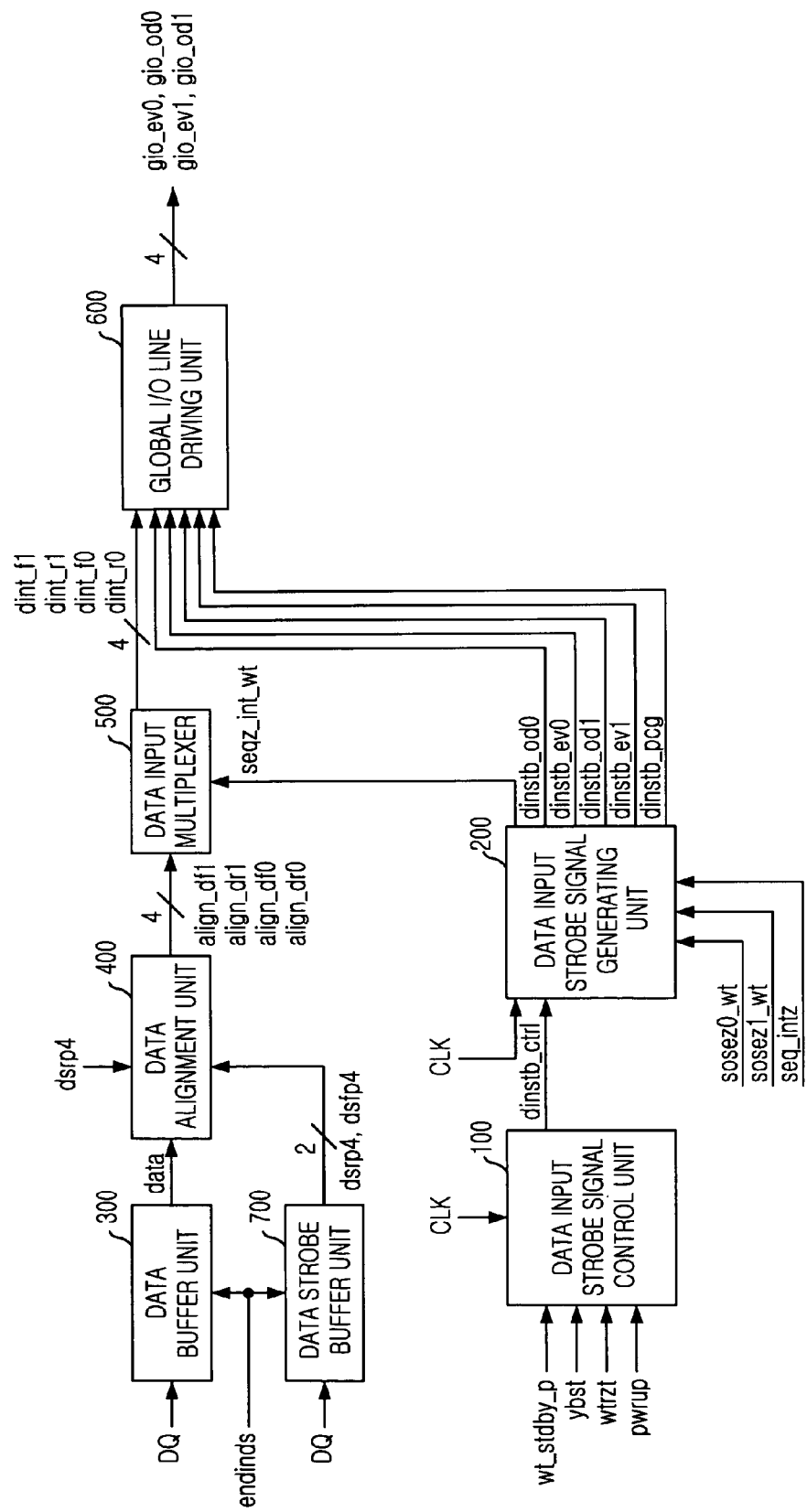
FIG. 12 is a block diagram of a memory device in accordance with a preferred embodiment of the present invention.

FIG. 12 is a block diagram of a memory device in accordance with an embodiment of the present invention.

Referring to FIG. 12, the memory device in accordance with the present invention includes: a data alignment unit 400 for receiving data, which are inputted in response to a write command, in synchronization with a clock signal and aligning in parallel a plurality of data, which are sequentially inputted through one data input pin DQ, as many as the number of prefetched data to thereby output four aligned data align_dr0, align_df0, align_dr1 and align_df1; a global I/O line driving unit 600 for receiving the four aligned data align_dr0, align_df0, align_dr1 and align_df1 to output even data gio_ev0 and gio_ev1 or odd data gio_od0 and gio_od1 to a memory core area in response to data input strobe signals dinstb_od0, dinstb_ev0, dinstb_ev1 and dinstb_od1; a data input strobe signal generating unit 200 for buffering a clock signal CLK to output the data input strobe signals dinstb_od0, dinstb_ev0, dinstb_ev1 and dinstb_od1; and a data input strobe signal control unit 100 for outputting a data input strobe control signal dinstb_ctrl used to control the data input strobe signal generating unit 200 to output the data input strobe signals dinstb_od0, dinstb_ev0, dinstb_ev1 and dinstb_od1 only at a period an operation corresponding to the write command is carried out. The memory device further includes a data buffer unit 300 for buffering data inputted through the data input pin and transferring the buffered data to the data alignment unit 400.

In accordance with an embodiment of the present invention, the memory device further includes a data input multiplexer 500 for receiving the aligned data align_dr0, align_df0, align_dr1 and align_df1 from the data alignment unit 400 to output data dint_r0, dint_f0, dint_r1 and dint_f1, which are re-aligned according to an interleave mode or a sequential mode, to the global I/O line driving unit 600.

Additionally, according to the memory device of the present invention, the number of prefetched data is 4 bits, and the data input strobe signal generating unit 200 buffers the clock signal CLK to generate the first and second even data input strobe signals dinstb_ev0 and dinstb_ev1 and the first and second odd data input strobe signals dinstb_od0 and dinstb_od1 so that the global I/O line driving unit 600 can select the four re-aligned data dint_r0, dint_f0, dint_r1 and dint_f1, which are outputted from the data input multiplexer 500, and output the first and second even data gio_ev0 and gio_ev1 and the first and second odd data gio_od0 and gio_od1.

Figure 13:
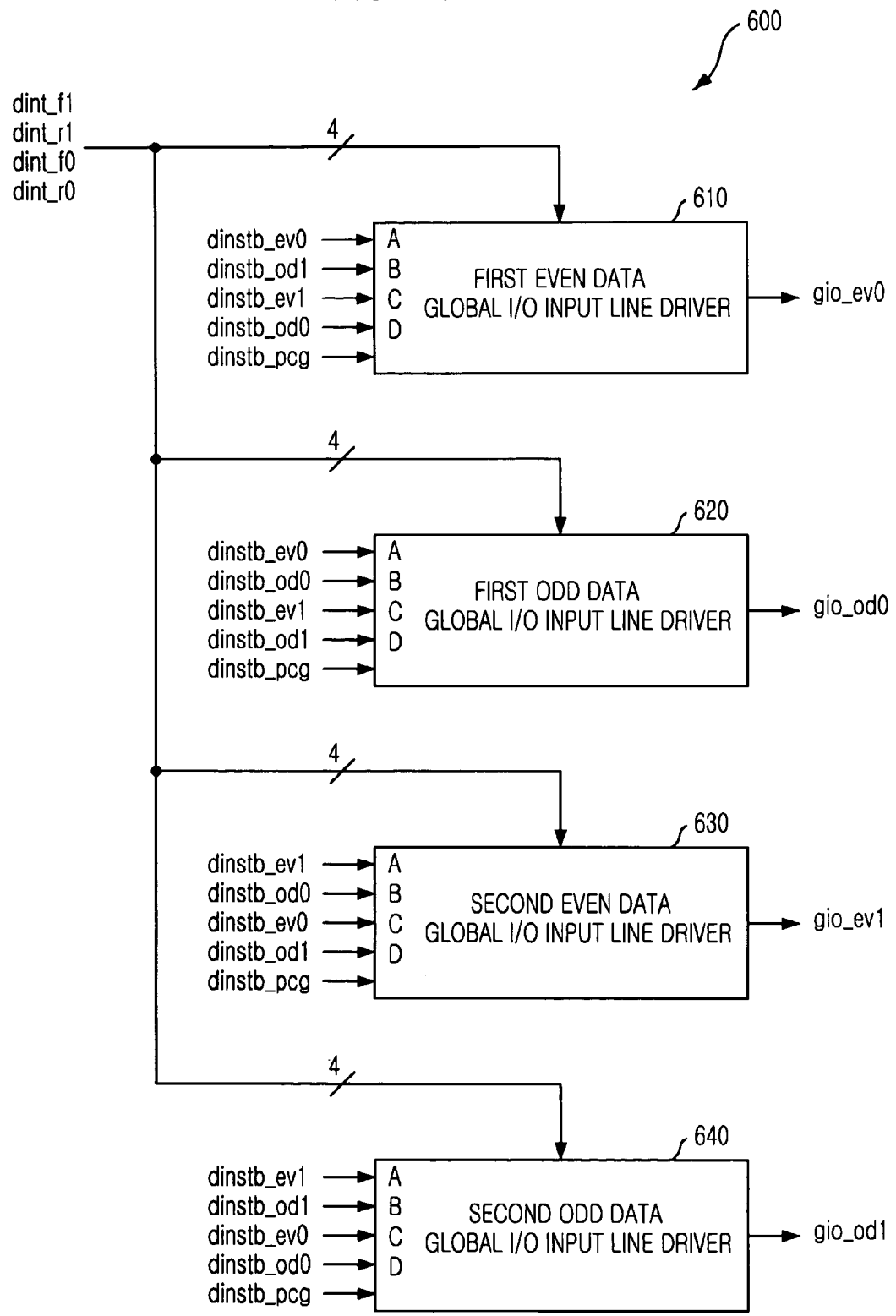
FIG. 13 is a block diagram of a global I/O line driving unit shown in FIG. 12.

FIG. 13 is a block diagram of the global I/O line driving unit shown in FIG. 12.

Referring to FIG. 13, the global I/O line driving unit 600 includes first and second even data global I/O line drivers 610 and 620 and first and second odd data global I/O line drivers 630 and 640, each of which has first to four control signal input terminals A to D. Each of the first and second even data global I/O line drivers 610 and 620 and the first and second odd data global I/O line drivers 630 and 640 receives the first and second even data input strobe signals dinstb_ev0 and dinstb_ev1 and the first and second odd data input strobe signals dinstb_od0 and dinstb_od1 through the first to four control signal input terminals A to D. At this time, the first and second even data global I/O line drivers 610 and 620 and the first and second odd data global I/O line drivers 630 and 640 receive the even data input strobe signals and the odd data input strobe signals in differently-aligned sequence and exclusively select the 4-bit data dint_r0, dint_r1, dint_f0 and dint_f1 re-aligned by the data input multiplexer 500 one by one to thereby output the first even data gio_ev0, the second even data gio_ev1, the first odd data gio_od0 and the second odd data gio_od1, respectively.

Figure 14:
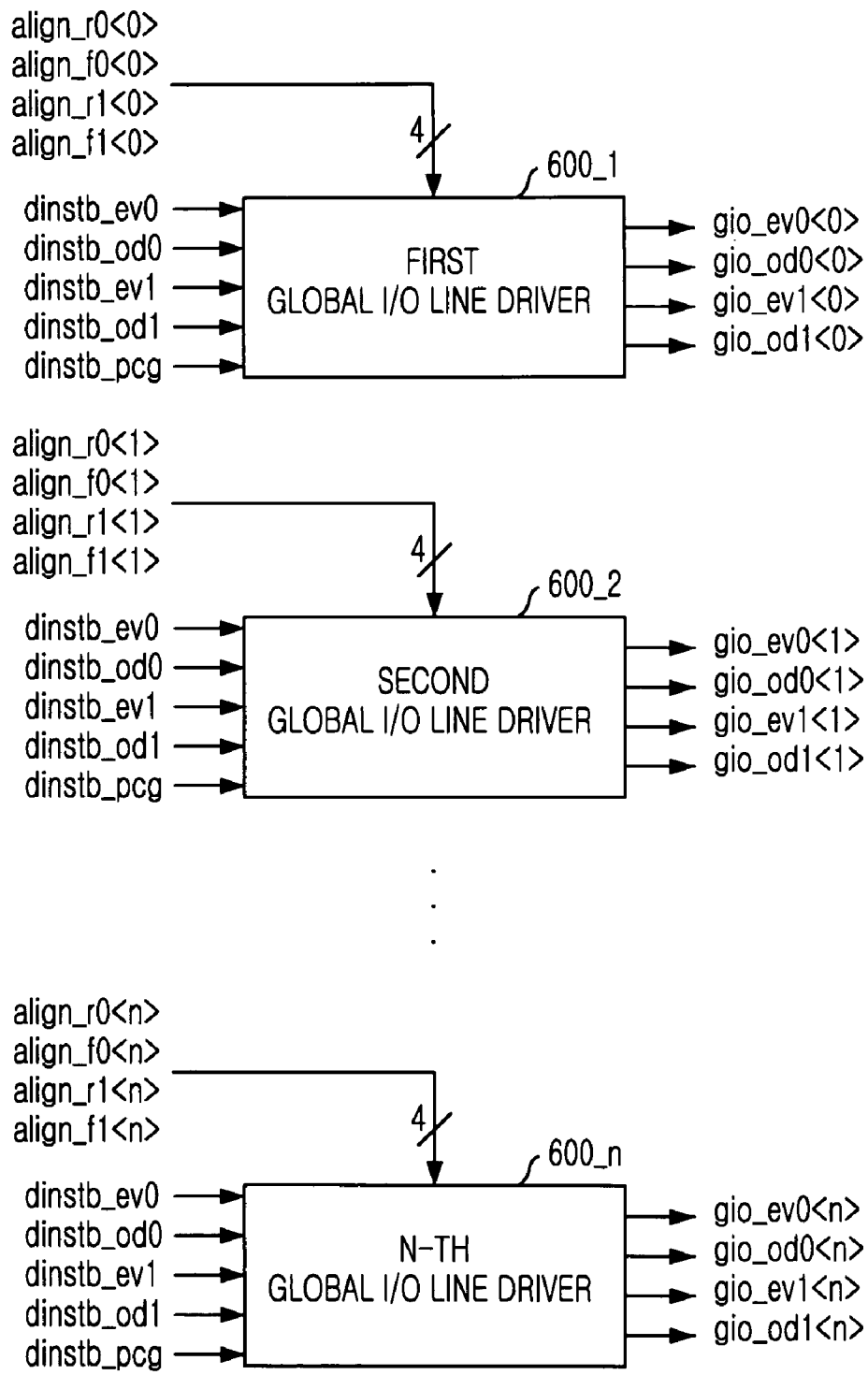
FIG. 14 is a block diagram of a plurality of global I/O line driving units that receive data inputted through a plurality of data pins in a memory device in accordance with the present invention.

FIG. 14 is a block diagram of a plurality of global I/O line driving units that receive data inputted through a plurality of data pins in the memory device in accordance with the present invention.

As described above, the general memory device receives a plurality of data through a plurality of data input pins in parallel. As shown in FIG. 14, the memory device in accordance with an embodiment of the present invention includes N numbers of global I/O line driving units 600_1, 600_2 and 600_n for receiving a plurality of aligned 4-bit data dint_r0<0>, dint_f0<0>, dint_r1<0>, dint_f1<0>. . . , dint_r0<n>, dint_f0<n>, dint_r1<n>, dint_f1<n>, which are inputted through first to N-th data input pins and then aligned, and outputting a first group of first and second even data and first and second odd data gio_ev0<0>, gio_ev1<0>, gio_od0<0> and gio_od1<0>, a second group of first and second even data and first and second odd data gio_ev0<1>, gio_ev1<1>, gio_od0<1> and gio_od1<1>, and an N-th group of first and second even data and first and second odd data gio_ev0<n>, gio_ev1<n>, gio_od0<n> and gio_od1<n>, respectively. FIG. 12 illustrates the data input unit connected to one data input pin.

Figure 15:
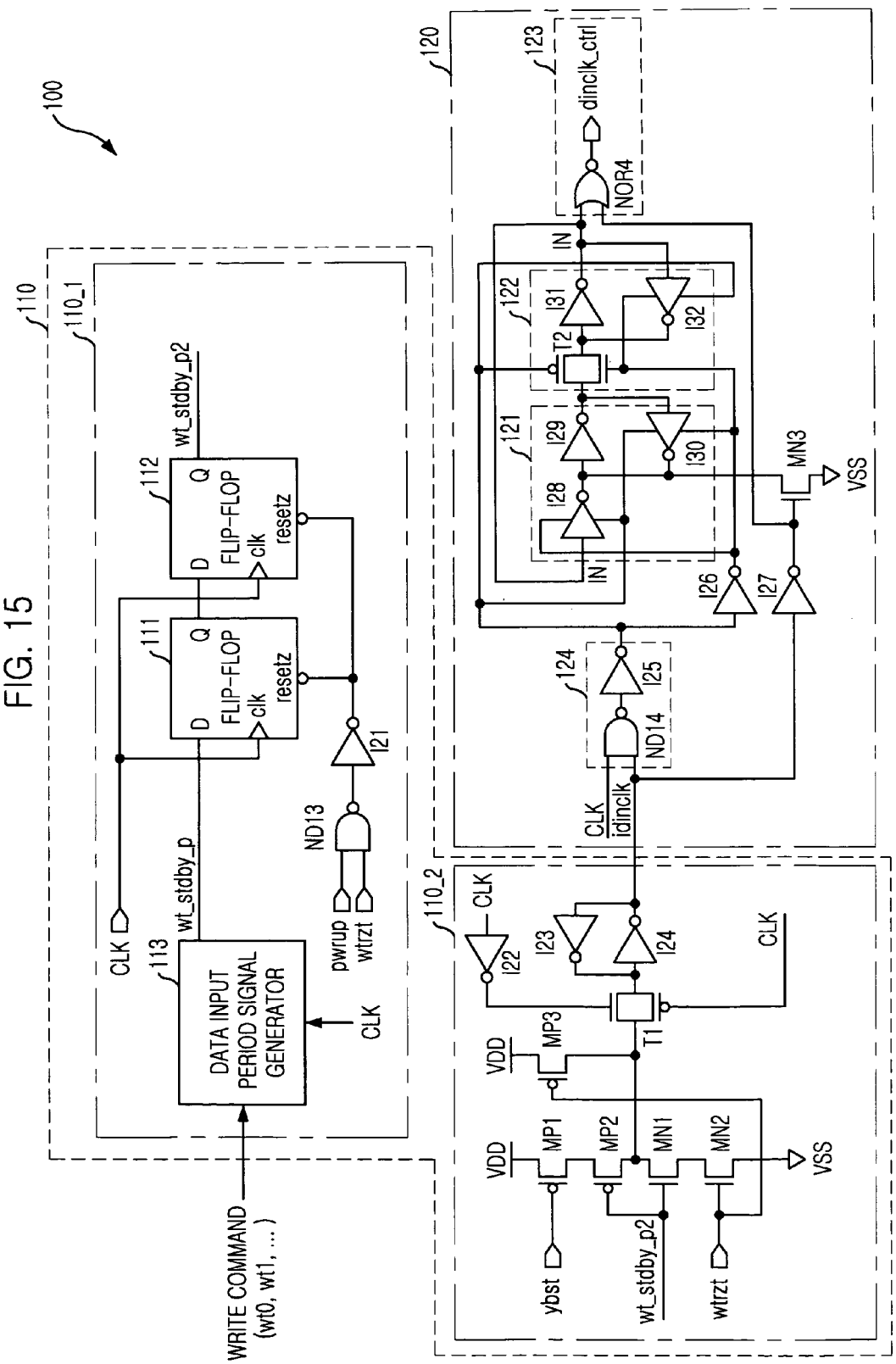
FIG. 15 is a circuit diagram of a data input strobe signal control unit shown in FIG. 12.

FIG. 15 is a circuit diagram of the data input strobe signal control unit shown in FIG. 12.

Referring to FIG. 15, the data input strobe signal control unit 100 includes a data input enable detecting unit 110 and a data input strobe control signal generating unit 120. The data input enable detecting unit 110 detects a period at which an operation corresponding to the write command is carried out to activate a data input enable signal idinclk. The data input strobe control signal generating unit 120 generates a data input strobe control signal dinclk_ctrl provided by dividing the clock signal CLK by N periods (where, N is a positive integer greater than 2 and in this embodiment, N is 2) during a period at which the data input enable signal idinclk is activated.

Additionally, the data input strobe control signal generating unit 120 includes dividers 121 to 124 for dividing the clock signal CLK by 2 during the period at which the data input enable signal idinclk is activated to thereby output the data input strobe control signal dinclk_ctrl.

The data input strobe control signal generating unit 120 includes: a first logic combination unit 124 for buffering the clock signal CLK during the period at which the data input enable signal idinclk is activated; a first latch unit 121 for buffering and outputting a control signal IN if an output of the first logic combination unit 124 (i.e., an output of an inverter I25) is a high level, and for latching the control signal IN if the output of the first logic combination unit 124 is a low level; a second latch unit 122 for receiving and inverting the latched control signal of the first latch unit 121 to output the control signal IN if the output of the first combination unit 124 is a low level, and for latching again the control signal IN if the output of the first logic combination unit 124 is a high level; and a second logic combination unit for combining the control signal IN and the inverted data input enable signal to output the data input strobe control signal dinclk_ctrl.

The data input enable detecting unit 110 includes a data input period signal generator 113, a first data input enable detector 110_1 and a second data input enable detector 110_2. The data input period signal generator 113 generates a data input period signal wt_stdby_p that is activated as much as period at which all data (e.g., D0 to D3) corresponding to the write command are inputted. The first data input enable detector 110_1 is activated in response to a power-up signal pwrup for detecting a stable power supply and a write enable signal wtrzt that maintains an active state at a data write operation, and delays the data input period signal wt_stdby_p for a predetermined period (in this embodiment, 2 periods) of the clock signal CLK. The second data input enable detector 110_2 is activated in response to the write enable signal wtrzt, and synchronizes a delayed data input period signal wt_stdby_p2 with a timing of the clock signal CLK when the last data among the data inputted in response to the write command is inputted, thereby outputting the data input enable signal idinclk.

Figure 16:
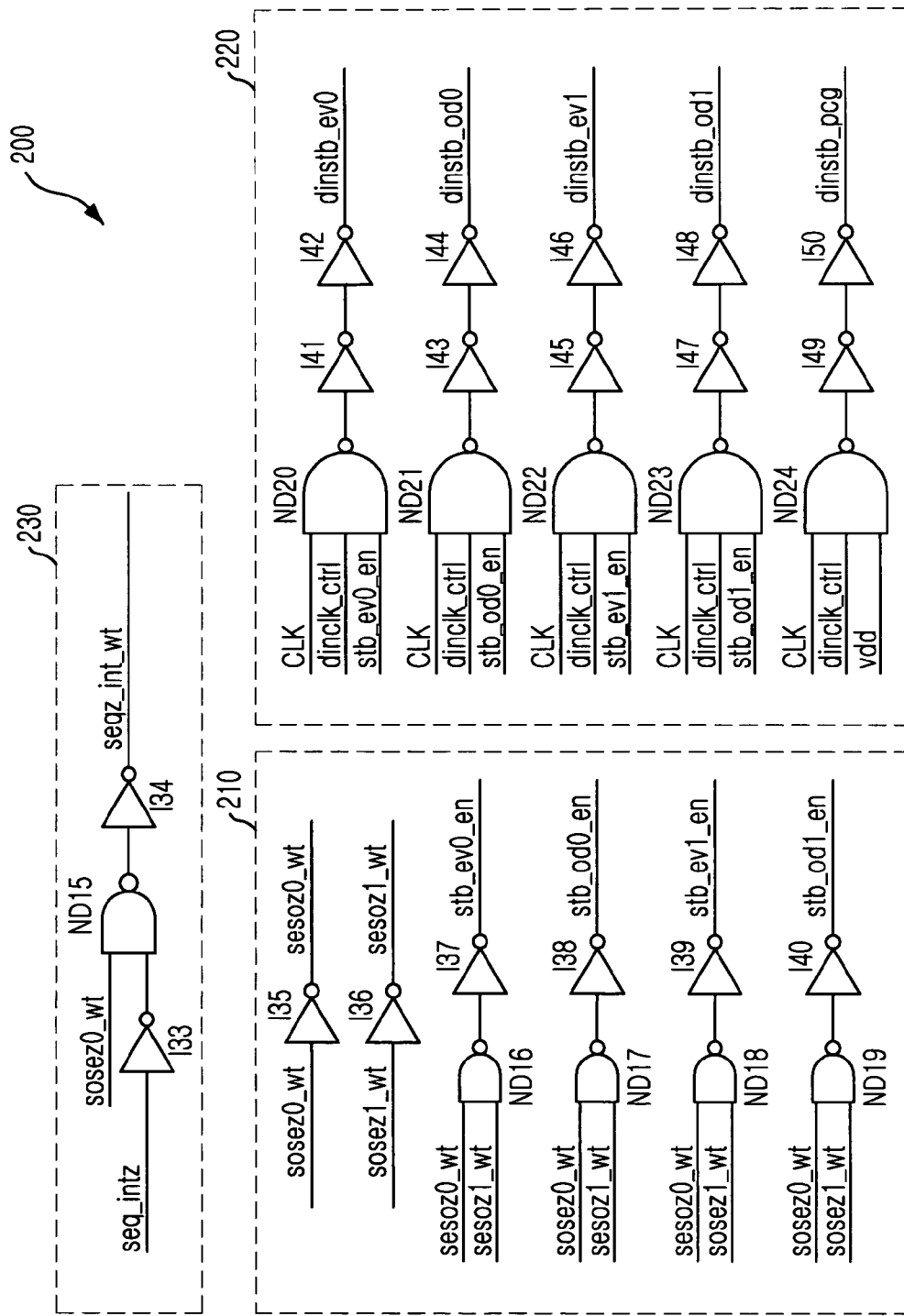
FIG. 16 is a circuit diagram of a data input strobe signal generating unit shown in FIG. 12.

FIG. 16 is a circuit diagram of the data input strobe signal generating unit shown in FIG. 12.

Referring to FIG. 16, data input strobe signal generating unit 200 includes an address decoding unit 210 and a data input strobe signal output unit 220. The address decoding unit 220 decodes lower address signals sosez0_wt and sosez1_wt corresponding to the number of data inputted in response to the write command among addresses inputted in response to the write command. The data input strobe signal output unit 220 buffers the clock signal CLK in response to the decoded result of the address decoding unit 210 and outputs the data input strobe signals dinstb_od0, dinstb_ev0, dinstb_ev1 and dinstb_od1, in which the data input strobe signal output unit 220 is enabled in response to the data input strobe control signal dinclk_ctrl outputted from the data input strobe control unit 110.

Additionally, the address decoding unit 210 includes: inverters I35 and I36 receiving the first and second address signals sosez0_wt and sosez1_wt, which are lower 2-bit address signals, among the addresses inputted in response to the write command, respectively; a first AND logic gate circuit consisting of a NAND gate ND16 and an inverter I37, for receiving output signals sesoz0_wt and sosoz1_wt of the inverters I35 and I36 to output a first decoding signal stb_ev0_en; a second AND logic gate circuit consisting of a NAND gate ND17 and an inverter I38, for receiving the first address signal sosez0_wt and the output signal sesoz0_wt of the inverter I36 to output a second decoding signal stb_od0_en; a third AND logic gate circuit consisting of a NAND gate ND18 and an inverter I39, for receiving the output signal sesoz0_wt of the inverter I35 and the second address signal sosez1_wt to output a third decoding signal stb_ev1_en; and a fourth AND logic gate circuit consisting of a NAND gate ND19 and an inverter I40, for receiving the first and second address signals sosez0_wt and sosez1_wt to output a fourth decoding signal stb_od1_en.

The data input strobe signal output unit 220 includes: a fifth AND logic gate circuit consisting of a NAND gate ND20 and inverters I41 and I42, for receiving the clock signal CLK, the first decoding signal stb_ev0_en and the data input strobe control signal dinclk_ctrl to output the first even data input strobe signal dinstb_ev0; a sixth AND logic gate circuit consisting of a NAND gate ND21 and inverters I43 and I44, for receiving the clock signal CLK, the second decoding signal stb_od0_en and the data input strobe control signal dinclk_ctrl to output the first odd data input strobe signal dinstb_od0; a seventh AND logic gate circuit consisting of a NAND gate ND22 and inverters I45 and I46, for receiving the clock signal CLK, the third decoding signal stb_ev1_en and the data input strobe control signal dinclk_ctrl to output the second even data input strobe signal dinstb_ev1; and a eighth AND logic gate circuit consisting of a NAND gate ND23 and inverters I47 and I48, for receiving the clock signal CLK, the fourth decoding signal stb_od1_en and the data input strobe control signal dinclk_ctrl to output the second odd data input strobe signal dinstb_od1.

Additionally, the data input strobe signal generating unit 200 includes a multiplexer control unit 230. The multiplexer control unit 230 receives a data input mode control signal seq_intz, which is determined according to the interleave mode or the sequential mode, in response to the write command and allows the data input multiplexer to be realigned to the data input mode corresponding to the write command.

The data input multiplexer control unit 230 includes: an inverter I33 for inverting the data input mode control signal seq_intz that maintains a low level in the interleave mode and a high level in the sequential mode; and an AND logic gate circuit consisting of a NAND gate ND15 and an inverter I34, for receiving an output of the inverter I33 and the address signal sosez0_wt of a least significant bit (LSB) among the addresses inputted in response to the write command to output a data input multiplexer control signal seqz_int_wt.

Figure 17:
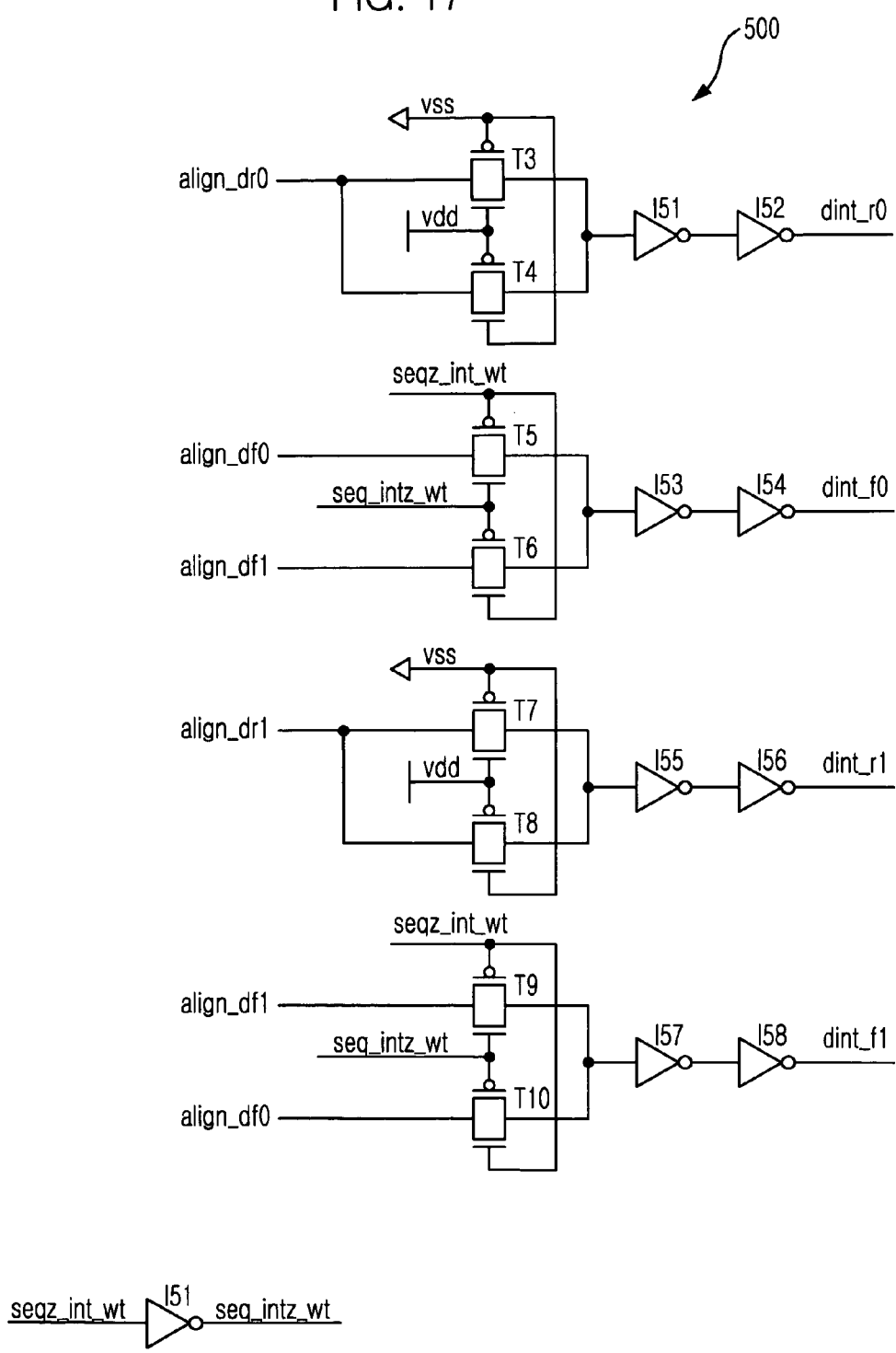
FIG. 17 is a circuit diagram of a data input multiplexer.

FIG. 17 is a circuit diagram of the data input multiplexer.

Referring to FIG. 17, the data input multiplexer 500 includes: transmission gates T3 and T4 for receiving the first to fourth aligned data align_dr0, align_df0, align_dr1 and align_df1, which are aligned by the data alignment unit 400, and being turned on in response to the data input multiplexer control signal seqz_int_wt to thereby transmit the first aligned data align_dr0 to the global I/O line driving unit 600; transmission gates T5 and T6 which are selectively turned on in response to the data input multiplexer control signal seqz_int_wt to transmit the second aligned data align_df0 or the fourth aligned data align_df1 to the global I/O line driving unit 600, respectively; transmission gates T7 and T8 which are turned on in response to the data input multiplexer control signal seqz_int_wt to transmit the third aligned data align_dr1 to the global I/O line driving unit 600; and transmission gates T9 and T10 which are selectively turned on in response to the data input multiplexer control signal seqz_int_wt to transmit the fourth aligned data align_df1 or the second aligned data align_df0 to the global I/O line driving unit 600, respectively. Here, the transmission gates T7 and T9 and the transmission gates T8 and T10 are turned on exclusively each other.

Figure 18:
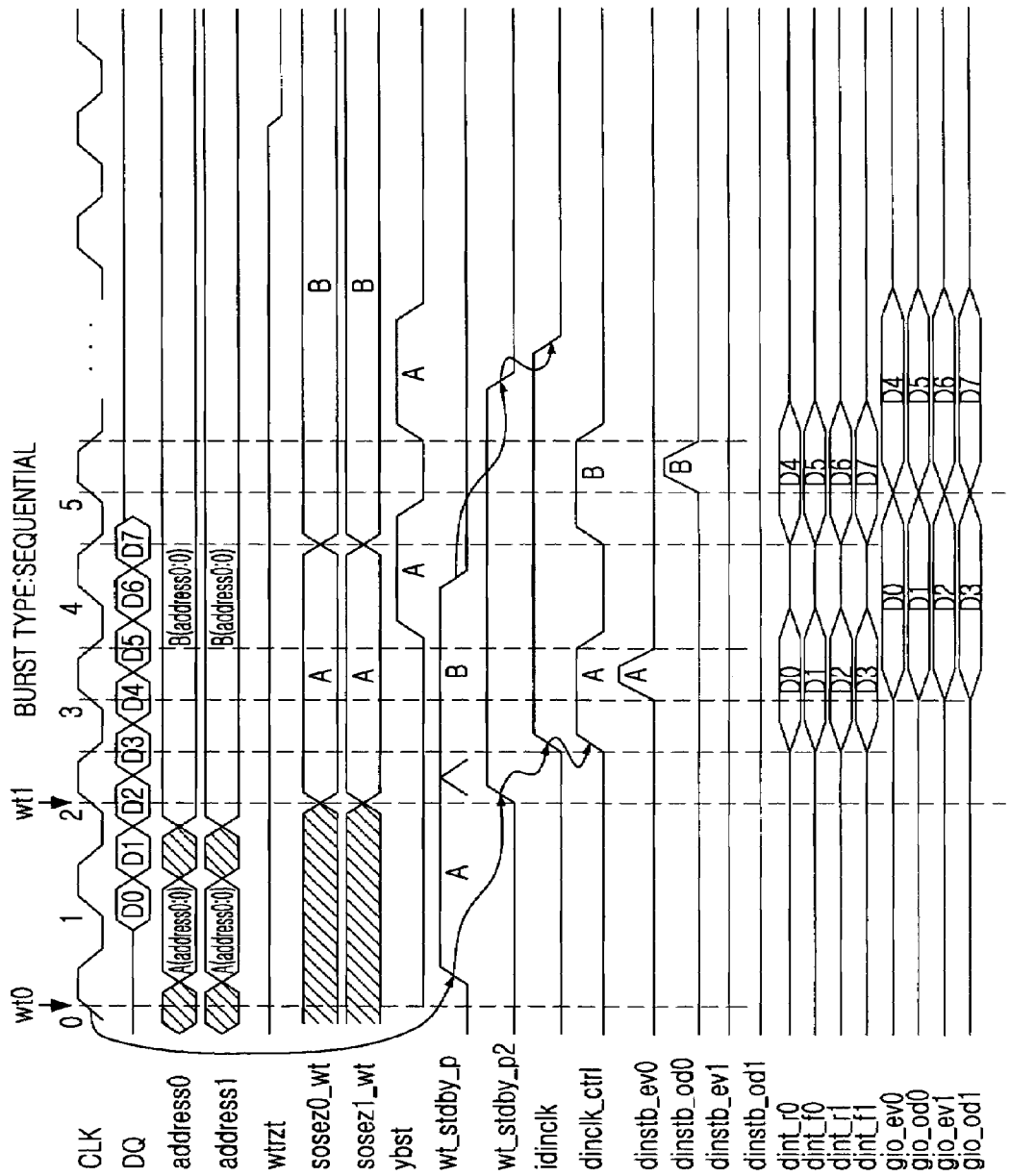
FIG. 18 is a waveform illustrating an operation of a memory device shown in FIG. 12.

FIG. 18 is a waveform illustrating an operation of the memory device shown in FIG. 12. Hereinafter, an operation of the memory device in accordance with an embodiment of the present invention will be described with reference to FIGS. 12 to 18.

As shown in FIG. 18, if the write commands wt0 and wt1 are inputted while the memory device is operating, corresponding addresses and data D0 to D7 are inputted in synchronization with the clock signal CLK. Here, the data D0 to D3 are inputted in response to the clock signal wt0, and the data D4 to D7 are inputted in response to the write command wt1. Meanwhile, the control signal wtrzt is a signal that maintains a high level during the write operation. Additionally, in FIG. 18, a waveform "A" is a waveform corresponding to the write command wt0 and a waveform "B" is a waveform corresponding to the write command wt1.

To begin with, an operation of the data input strobe signal control unit 100 will be described with reference to FIG. 15.

If the write commands wt0 and wt1 to be executed are inputted, the data input period signal generator 113 of the data input strobe signal control unit 100 activates the data input period signal wt_stdby_p that is a signal being activated during the data input period. In this manner, if four data are respectively inputted in response to the write commands wt0 and wt1, the data input period signal wt_stdby_p is outputted in an activated state of a high level for four clocks because two data are inputted for one clock period in the DDR synchronous memory device.

Then, the first data input enable detecting unit 110_1 of the data input strobe signal control unit 100 receives and shifts the data input period signal wt_stdby_p for two periods of the clock signal CLK. The first data input enable detecting unit 110_1 includes two flip-flops 111 and 112. The flip-flops 111 and 112 are reset by the power-up signal pwrup and the write enable signal wtrzt.

The power-up signal pwrup is a signal for detecting an input of a stable voltage to the memory device, and the write enable signal wtrzt is a signal activated when the memory device is in a data write mode.

Then, the second data input enable detecting unit 110_2 buffers the 2-clock-shifted data input period signal wt_stdby_p2 outputted from the first data input enable detecting unit 110_1 and generates the buffered signal to the data input strobe control signal generating unit 120.

At this time, if the clock signal CLK is a low level, the transmission gate T1 is turned on so that the 2-clock-shifted data input period signal wt_stdby_p2 is generated as the data input enable signal idinclk through the latch units I23 and I24 and outputted to the data input strobe control signal generating unit 120.

Here, in order to turn on the transmission gate T1 of the second data input enable detecting unit 110_2, a clock signal falling at a second time after the input of the write command wt0 is used. To turn on the transmission gate T1 after about two and a half clocks is for the purpose of turning on the transmission gate T1 after a necessary time when data is aligned after the input of the write command wt0 and then transferred to the internal core circuit.

If the last data D3 is inputted in response to the write command wt0, the data alignment unit 400 aligns the four data D0 to D3, and the aligned four data D0 to D4 are inputted to the global I/O line driving unit 600 through the data input multiplexer 500. After this timing (second falling of the clock signal CLK), the aligned data must be inputted to the memory core area. In order for that, the data input strobe signal generating unit 200 must output the data strobe signals dinstb_od0, dinstb_ev0, dinstb_od1 and dinstb_ev1 to the global I/O line driving unit 600.

Accordingly, from this timing (second falling of the clock signal CLK), the second data input enable detecting unit 110_2 activates the data input enable signal idinclk to a high level. Thereafter, the data input enable signal idinclk maintains an active state during the period at which the data input period signal wt_stdby_p is activated. Here, the data input enable signal maintains the activated state for four clocks in response to the successive two write commands wt0 and wt1.

Then, the data input strobe control signal generating unit 120 is first clocked at a timing when the data input enable signal idinclk is activated, and generates a signal that is obtained by dividing the clock signal CLK by two and then clocking the dividing clock signal. Then, the signal is outputted as the data input strobe control signal dinclk_ctrl to the data input strobe signal generating unit 200.

In other words, the data input strobe control signal dinclk_ctrl is a clocking signal that is obtained by dividing the clock signal by two at a period when the data input enable signal idinclk is activated.

The second data input enable detecting unit 110_2 is configured to receive a control signal ybst. Here, the control signal ybst is a signal that maintains a high level at a timing when the last data among data inputted successively in response to the write command is inputted.

The second data input enable detecting unit 110_2 receives the control signal ybst in order to maintain (for four clocks) the data input enable signal idinclk even in case when eight data are sequentially inputted in response to the write command.

Since the data input period signal wt_stdby_p2 is a signal that is sustained for two clocks, the data input strobe signal is generated two times in order to align four data and transmit the aligned data to the internal core area, in case eight data are sequentially inputted in response to the write command. Therefore, the data input strobe control signal dinclk_ctrl must be generated two times.

Accordingly, since the data input enable signal idinclk must be sustained for four clocks, the control signal ybst is received in order to prevent the data input enable signal idinclk from being inactivated after two clocks due to the data input period signal wt_stdby_p2 that is sustained for two clocks.

Hereinafter, an operation of the data input strobe signal generating unit 100 will be described in detail with reference to FIG. 16.

First, the inverters I35 and I36 provided in the address decoding unit 210 of the data input strobe signal generating unit 200 receives and inverts the first and second address signals sosez0_wt and sosez1_wt, which are generated by buffering the address signal that corresponds to the last two bits among the addresses inputted in response to the write command. Then, two signals among the first and second address signals sosez0_wt and sosez1_wt and the outputs sesoz0_wt and sosez1_wt are inputted to the four AND logic gate circuits consisting of the NAND gates ND16 to ND19 and the inverters I37 to I40. Therefore, one of the first to fourth decoding signals stb_ev0_en, stb_od0_en, stb_ev1_en and stb_od1_en is activated in response to levels of the first and second address signals sosez0_wt and sosez1_wt.

Then, one of the four NAND gates ND20 to ND24 provided in the data input strobe signal output unit 220 is selected by one of the first to fourth decoding signals stb_ev0_en, stb_od0_en, stb_ev1_en and stb_od1_en.

A following Table 1 shows the first to fourth decoding signals stb_ev0_en, stb_od0_en, stb_ev1_en and stb_od1_en that are decoded with respect to the signal levels of the first and second address signals sosez0 wt and sosez1 wt.

TABLE 1

| sosez0_wt | sosez_wt | stb_ev0_en | stb_od0_en | stb_evl_en | stb_odl_en |
|---|---|---|---|---|---|
| 0 | 0 | 1 | 0 | 0 | 0 |
| 1 | 0 | 0 | 1 | 0 | 0 |
| 0 | 1 | 0 | 0 | 1 | 0 |
| 1 | 1 | 0 | 0 | 0 | 1 |

Then, the clock signal CLK is inputted to the selected NAND gate and buffered during the data input strobe control signal dinclk_ctrl is activated to a high level to thereby output one of the first and second even data input strobe signals dinstb_ev0 and dinstb_ev1 and the first and second_odd data input strobe signals dinstb_od0 and dinstb_od1.

The global I/O line driving unit 20 receives the aligned data dint_r0, dint_f0, dint_r1 and dint_f1 and outputs the first and second even data gio_ev9 and gio_ev1 and the first and second odd data gio_od0 and gio_od1 in response to the data input strobe signals dinstb_ev0, dinstb_ev1, dinstb_od0 and dinstb_od1.

The global input I/O line driving unit 20 shown in FIG. 13 includes the first and second even data global I/O line drivers 610 and 620 and the first and second odd data global I/O line drivers 630 and 640. At this time, the four line drivers 610 to 640 have the same configuration.

However, the four line drivers 610 to 640 receives the different combinations of the data input strobe signals dinstb_ev0, dinstb_ev1, dinstb_od0 and dinstb_od1 through their input terminals A to D and outputs one of the inputted four aligned data as the first even data gio_ev0, the second even data gio_ev1, the first odd data gio_od0 or the second even data gio_od1.

Meanwhile, the data multiplexer 500 re-aligns the four data align_dr0, align_df0, align_dr1 and align_df1, which are aligned in the data alignment unit 400, in response to the data input multiplexer control signal seqz_int_wt determined according to the interleave mode or the sequential mode of the data corresponding to the write command, and then outputs the re-aligned data to the global I/O line driving unit.

The data input multiplexer control signal seqz_int_wt is a signal outputted from the data input strobe signal generating unit 200, and the multiplexer control unit 230 of the data input strobe signal generating unit 200 receives the first address signal sosez0_wt and the data mode select signal seq_intz to output the data input multiplexer control signal seqz_int_wt that maintains a low level at the interleave mode and a high level at the sequential mode.

The data input multiplexer 500 outputs the four data align_dr0, align_df0, align_dr1 and align_df1 aligned in the data alignment unit 400 in response to the data input multiplexer control signal seqz_int_wt as it is, or re-aligns the four data align_dr0, align_df0, align_dr1 and align_df1 and outputs the re-aligned data to the global I/O line driving unit 600.

For example, in case the data input multiplexer control signal seqz_int_wt is in a low level, the four aligned data align_dr0, align_df0, align_dr1 and align_df1 are outputted as the re-aligned data dint_r0, dint_f0, dint_r1 and dint_f1. In case the data input multiplexer control signal seqz_int_wt is in a high level, the re-aligned data generated by exchanging the second and fourth data of the four aligned data align_dr0, align_df0, align_dr1 and align_df1 are outputted to the global I/O line driving unit.

Figure 19:
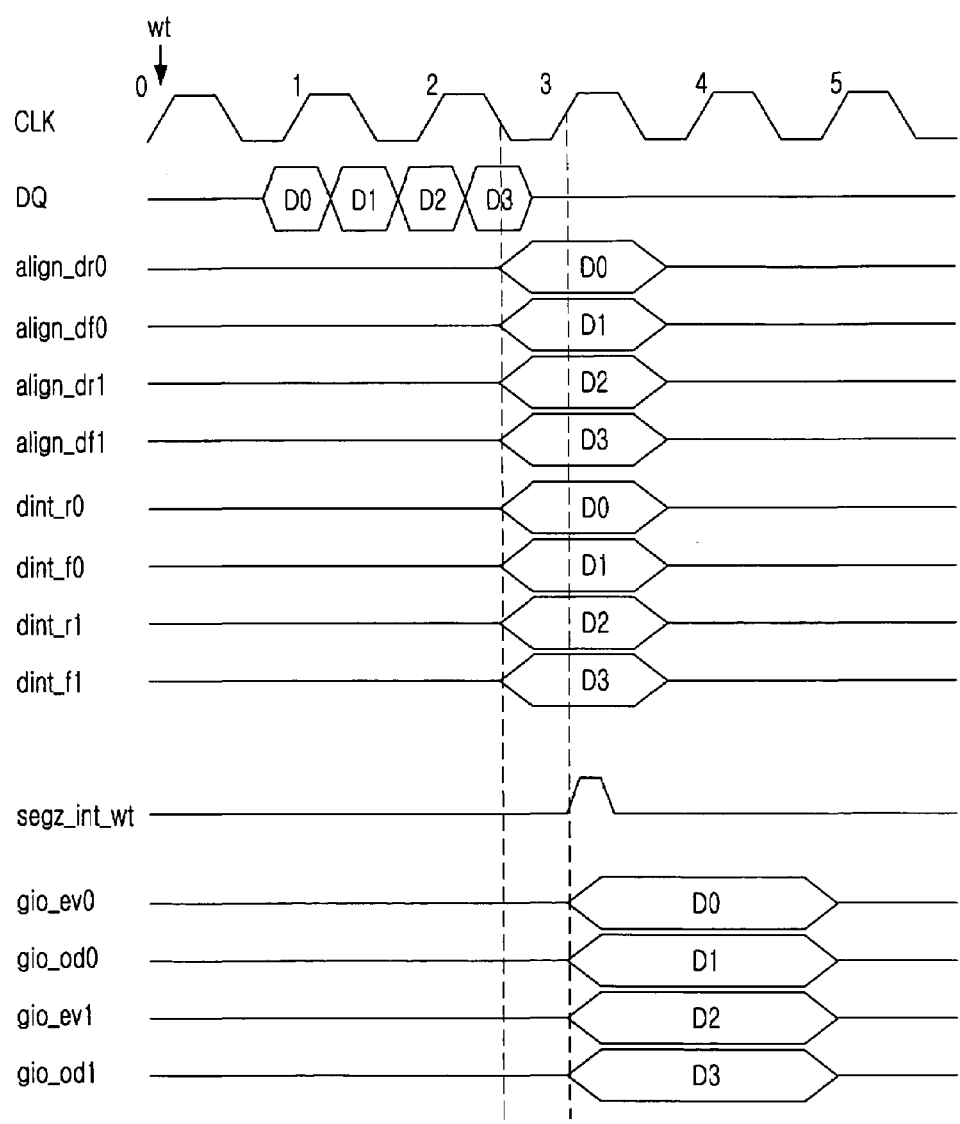
FIG. 19 is a waveform illustrating a process of receiving data in a sequential mode in a memory device of FIG. 12.
Figure 20:
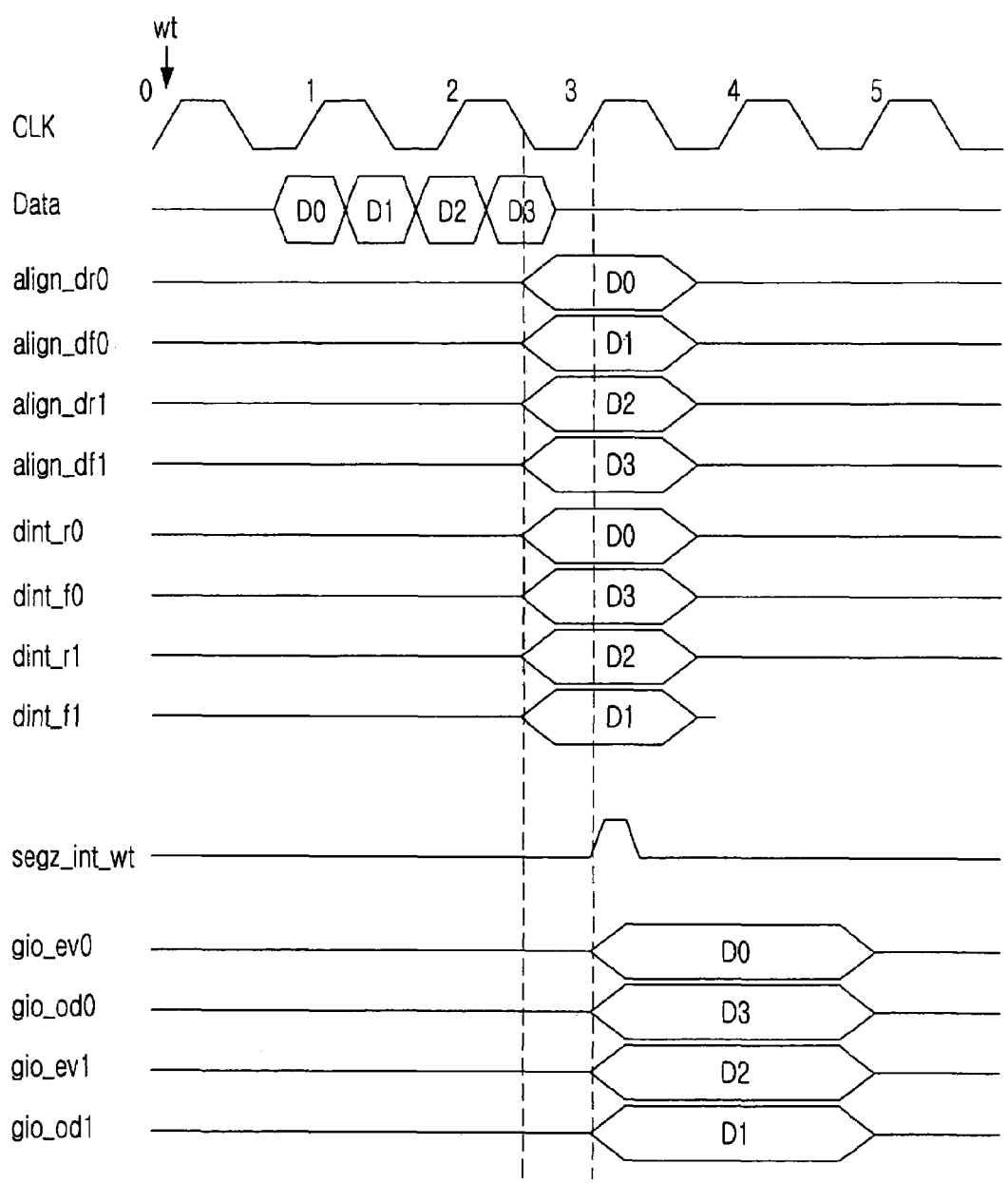
FIG. 20 is a waveform illustrating a process of receiving data in an interleave mode in a memory device of FIG. 12.

FIG. 19 is a waveform illustrating an operation of inputting the data to the memory device of FIG. 12 at the sequential mode, and FIG. 20 is a waveform illustrating an operation of inputting the data to the memory device of FIG. 12 at the interleave mode.

In FIG. 19, in case the data input multiplexer control signal seqz_int_wt is in a low level, the four aligned data align_dr0, align_df0, align_dr1 and align_df1 are outputted as the re-aligned data dint_r0, dint_f0, dint_r1 and dint_f1.

In FIG. 20, in case the data input multiplexer control signal seqz_int_wt is in a high level, the re-aligned data generated by exchanging the second and fourth data of the four aligned data align_dr0, align_df0, align_dr1 and align_df1 are outputted to the global I/O line driving unit.

According to the present invention, since the data input strobe signal generated in order to transmit the inputted data to the internal core area are generated only at a timing when the data are actually transmitted to the internal core area, the power consumption of the data input unit can be remarkably reduced compared with the conventional memory device in which the data input strobe signal is always generated.

Additionally, since the memory device in accordance with the present invention generates the data input strobe signal only at a timing when the data are actually transmitted to the internal core area, a timing margin in a generation of the data input strobe signal is increased, thereby improving an entire operating speed (more than 500 MHz).

Further, since the memory device in accordance with the present invention remarkably simplifies the signals that are inputted to the data alignment unit for receiving the aligned data and outputting the first and second even data and the first and second odd data, a circuit area of the data input unit is reduced much more compared with the conventional memory device, thereby reducing greatly an entire layout area of the memory device.

While the present invention has been described with respect to the particular embodiments, it will be apparent to those skilled in the art that various changes and modifications may be made without departing from the scope of the invention as defined in the following claims.

What is claimed is:

1. A synchronous memory device receiving data in synchronization with a clock signal, the data being inputted in response to a write command, the synchronous memory device comprising:

a data alignment means for aligning in parallel a plurality of data sequentially inputted through one data input pin as many as the number of prefetched data to generate a plurality of aligned data;

a global I/O line driving means for receiving the plurality of aligned data and outputting the even data or the odd data to a memory core area in response to a data input strobe signal;

a data input strobe signal generating means for buffering the clock signal to output the data input strobe signal; and a data input strobe signal control means for generating a data input strobe control signal used to allow the data input strobe signal generating means to output the data input strobe signal only at a period when an operation corresponding to the write command is carried out.

2. The synchronous memory device as recited in claim 1, wherein the data input strobe signal generating means includes:
    an address decoding unit for decoding a lower address signal corresponding to the number of the data inputted in response to the write command among addresses inputted in response to the write command; and
    a data input strobe signal output unit for buffering the clock signal in response to the decoding result of the address decoding unit, the data input strobe signal output unit being enabled in response to the data input strobe control signal outputted from the data input strobe control means.

3. The synchronous memory device as recited in claim 2, wherein the number of prefetched data is four bits, and the data input strobe signal generating means buffers the clock signal to generate even data input strobe signals and first and second odd data input strobe signals in order to allow the global I/O line driving unit to selectively output the four aligned data as first and second even data and first and second odd data.

4. The synchronous memory device as recited in claim 3, wherein the address decoding unit includes:
    first and second inverters receiving first and second address signals corresponding to lower two bits among the addresses inputted in response to the write command;
    a first AND logic gate circuit for receiving outputs of the first and second inverters to output a first decoding signal;
    a second AND logic gate circuit for receiving the first address signal and the output of the second inverter to output a second decoding signal;
    a third AND logic gate circuit for receiving the output of the first inverter and the second address signal to output a third decoding unit; and
    a fourth AND logic gate circuit for receiving the first and second address signals to output a fourth decoding signal.

5. The synchronous memory device as recited in claim 4, wherein the data input strobe signal output unit includes:
    a fifth AND logic gate circuit for receiving the clock signal, the first decoding signal and the data input strobe control signal to output the first even data input strobe signal;
    a sixth AND logic gate circuit for receiving the clock signal, the second decoding signal and the data input strobe control signal to output the first odd data input strobe signal;
    a seventh AND logic gate circuit for receiving the clock signal, the third decoding signal and the data input strobe control signal to output the second even data input strobe signal; and
    a eighth AND logic gate circuit for receiving the clock signal, the fourth decoding signal and the data input strobe control signal to output the second odd data input strobe signal.

6. The synchronous memory device as recited in claim 3, wherein the global I/O line driving means includes first and second even data global I/O line drivers and first and second odd data global I/O line drivers, each of which has first to four control signal input terminals, each of the first and second even data global I/O line drivers and the first and second odd data global I/O line drivers receiving the first and second even data input strobe signals and the first and second odd data input strobe signals through the first to four control signal input terminals in differently-aligned sequence and exclusively selecting the 4-bit data one by one to thereby output the first even data, the second even data, the first odd data and the second odd data, respectively.

7. The synchronous memory device as recited in claim 1, further comprising a data input multiplexer for re-aligning the aligned data outputted from the data alignment means according to an interleave mode or a sequential mode to output the re-aligned data to the global I/O line driving means.

8. The synchronous memory device as recited in claim 7, wherein the data input strobe signal generating means includes a data input multiplexer control unit for receiving a data input mode control signal determined according to the interleave mode or the sequential mode in response to the write command and outputting a data input multiplexer control signal to allow the data input multiplexer to be re-aligned to the data input mode corresponding to the write command.

9. The synchronous memory device as recited in claim 8, wherein the data input multiplexer control unit includes:
    an inverter for inverting the data input mode control signal, the data input mode control signal maintaining a low level in the interleave mode and a high level in the sequential mode; and
    an AND logic gate circuit for receiving an output of the inverter and the address signal of a least significant bit (LSB) among the addresses inputted in response to the write command to output the data input multiplexer control signal.

10. The synchronous memory device as recited in claim 8, wherein the data input multiplexer includes:
    first and second transmission gates for receiving the first to fourth aligned data aligned by the data alignment means, and being turned on in response to the data input multiplexer control signal to transmit the first aligned data to the global I/O line driving means;
    third and fourth transmission gates being selectively turned on in response to the data input multiplexer control signal to transmit the second aligned data or the fourth aligned data to the global I/O line driving means, respectively;
    fifth and sixth transmission gates being turned on in response to the data input multiplexer control signal to transmit the third aligned data to the global I/O line driving means; and
    seventh and eighth transmission gates being selectively turned on in response to the data input multiplexer control signal to transmit the fourth aligned data or the second aligned data to the global I/O line driving means, respectively,
    the third and seventh transmission gates and the fourth and eighth transmission gates are turned on exclusively each other.

11. The synchronous memory device as recited in claim 1, wherein the data input strobe signal control unit includes:
    a data input enable detector for detecting a period at which the operation corresponding to the write command is carried out and activating a data input enable signal; and
    a data input strobe control signal generator for generating the data input strobe control signal provided by dividing the clock signal by N periods during a period at which the data input enable signal is activated, N being a positive integer greater than 2.

12. The synchronous memory device as recited in claim 11, wherein the data input strobe control signal generator includes a divider for outputting the data input strobe control signal by diving the clock signal by two during a period at which the data input enable signal is activated.

13. The synchronous memory device as recited in claim 11, wherein the data input strobe control signal generator includes:
- a first logic combination unit for buffering the clock signal during the period at which the data input enable signal is activated;
- a first latch unit 121 for buffering and outputting a control signal at a first level of the signal outputted from the first logic combination unit and latching the inputted control signal at a second level of the signal outputted from the first logic combination unit;
- a second latch unit for inverting the control signal latched in the first latch unit at the second level of the signal outputted from the first logic combination unit to output the control signal, and latching again the control signal at the first level of the signal outputted from the first logic combination unit; and
- a second logic combination unit for combining the control signal and the data input enable signal to output the data input strobe control signal.

14. The synchronous memory device as recited in claim 11, wherein the data input enable detector includes:
- a data input period signal generator for generating a data input period signal activated as long as a period at which all data corresponding to the write command are inputted;
- a first data input enable detector for delaying the data input period signal for predetermined periods of the clock signal, the first data input enable detector being activated in response to a power-up signal for detecting a stable power supply and a write enable signal activated at a write mode; and
- a second data input enable detector for synchronizing the delayed data input period signal with a timing of the clock signal when the last data is inputted in response to the write command and outputting the data input enable signal, the second data input enable detector being activated in response to the write enable signal.

* * * * *